United States Patent [19]
Minami et al.

[11] Patent Number: 5,636,191
[45] Date of Patent: Jun. 3, 1997

[54] POSITIONING CONTROL SYSTEM UTILIZING OPTICAL BEAM HAVING SERVO-ERROR SIGNAL GENERATING CIRCUIT

[75] Inventors: Akira Minami; Shigeyoshi Tanaka, both of Kawasaki; Michio Matsuura, Tokyo; Hiromichi Kuwano, Yokohama; Kazuyuki Tamanoi, Hayami-gun, all of Japan

[73] Assignees: Fujitsu Limited; Texas Instruments Japan Limited, both of Japan

[21] Appl. No.: 421,226

[22] Filed: Apr. 13, 1995

Related U.S. Application Data

[62] Division of Ser. No. 96,491, Jul. 22, 1993, Pat. No. 5,566,143.

[30] Foreign Application Priority Data

Jul. 22, 1992 [JP] Japan ................................. 4-195373

[51] Int. Cl.$^6$ .................................................. G11B 7/09
[52] U.S. Cl. .................................. 369/44.35; 369/44.36; 369/44.11
[58] Field of Search .......................... 369/44.35, 44.36, 369/44.41, 44.42; 360/77.12; 327/360

Primary Examiner—Aristotelis Psitos
Assistant Examiner—Duncan Wilkinson
Attorney, Agent, or Firm—Greer, Burns & Crain, Ltd.

[57] ABSTRACT

A positioning control system for performing recording/reproducing operations by irradiating an optical beam to predetermined position on an optically recording medium, e.g., magneto-optical disk, includes a photo-detector constituted by at least two-divisional units; and a servo-error signal generating circuit which can generate at least one servo-error signal in accordance with a difference between the detection currents. Preferably, servo-error signal generating circuit includes at least one division circuit that has two pairs of transistors, two emitters in each pair of transistors being connected together into a common emitter, bias voltages of direct current type being applied to the respective bases of transistors on one side, the respective collectors of the transistors on one side being connected to a common connecting portion via resistors, the common connecting portion being connected to a power supply, the respective bases of transistors on the other side being connected together into a common base; and an integrating capacitor which is connected to the common base of transistors on the other side, and which integrates a difference between the current flowing through the common connecting portion and the reference current, to apply the thus integrated difference to the common base of transistors on the other side. Further, preferably, the photo-detector is connected to the common emitters in the respective pairs of transistors, so that the detection currents can flow through the common emitters.

4 Claims, 17 Drawing Sheets

TES
= (A+C)−(B+D)

FES
= (A+B)−(C+D)

POSITIONING CONTROL SYSTEM UTILIZING OPTICAL BEAM HAVING SERVO-ERROR SIGNAL GENERATING CIRCUIT

This is a division, of application Ser. No. 08/096,491, filed Jul. 7, 1993, now allowed, U.S. Pat. No. 5,566,143.

BACKGROUND OF THE INVENTION

1. Field of the Invention

The present invention relates to a positioning control system, which includes a tracking servo control and a focusing servo control utilizing an optical beam in a magneto-optical disk device, an optical disk device, an optical card, or the like, and which enables a desired track position, etc., to be accurately determined.

More specifically, the present invention relates to a positioning control system including a servo-error signal generating circuit, which can generate servo-error signal in accordance with a detection current output from at least one photo-detector for detecting the return optical beam reflected from a magneto-optical disk device, etc., so as to accurately irradiate a given optical beam to the desired track position (just focus position), etc., for recording/reproducing operations.

2. Description of the Related Art

In general, in a magneto-optical disk device, an optical disk device(sometimes including a magneto-optical disk device), or the like, recording/reproducing operations corresponding to write/read operations can be easily performed by utilizing an optical beam without necessity for complex mechanical elements such as a magnetic head, unlike a magnetic disk drive, a magnetic tape apparatus, or the like. Therefore, the former magneto-optical disk device, etc., can have a larger storage capacity than the latter magnetic disk device, etc. However, the magneto-optical disk device, etc., is likely to have a difficulty in positioning a given optical beam to the desired track position, etc.

In regard to the positioning control system of such an optical beam, two kinds of control operations are performed: one is a tracking servo control which enables the track following operations on an optically recording medium such a magneto-optical disk to be performed; and the other is a focusing servo control which enables a focusing position of the optical beam on the optically recording medium to be determined.

These control operations are executed in the following sequences:

First, the return optical beam, which is reflected from the optically recording medium, is detected by a plurality of photo-detectors in two-divisional configurations or in four-divisional configurations; and Second, a tracking servo-error signal used for tracking servo control and a focusing servo-error signal used for focusing servo control are simultaneously taken out by utilizing the respective photo-detectors.

In this case, to assure the servo control operations in the magneto-optical disk device, etc., by utilizing an optical beam only, it is necessary to provide a servo-error signal generating circuit which generates each of the above-mentioned servo-error signals adjusted to have a constant amplitude. Such an adjustment of each of the servo-error signals is usually achieved by executing an automatic gain control(AGC) for the servo-error signals on the basis of the detection current output from each of the photo-detectors.

Such a servo-error signal generating circuit including AGC circuit portion is generally constituted by a lot of electronic components, such as transistors and resistors. Therefore, a positioning control system having the servo-error signal generating circuit in a magneto-optical disk device, e.g., is likely to be large in size and expensive. To avoid this disadvantage, these electronic components are desired to be incorporated into an integrated circuit(IC), which can provide a desired circuit with a small size and in relatively low cost for fabrication.

Here, to enable a problem regarding a conventional positioning control system utilizing an optical beam to be understood more clearly, a concrete configuration of a positioning control system according to a prior art will be described with reference to the related drawings of FIGS. 1(A), 1(B), 1(C), 2 and 3. In this case, a positioning control system in a magneto-optical disk device will be illustrated representatively.

FIGS. 1(A), 1(B) and 1(C) are diagrams for explaining servo control operations for positioning control in a magneto-optical disk device. To be more specific, FIG. 1(A) is a perspective view schematically showing the whole construction of a magneto-optical disk device; FIG. 1(B) is a front view of each of photo-detectors of two-divisional type; and FIG. 1(C) is a front view of a photo-detector of four-divisional type.

In FIG. 1(A), 10 denotes a magneto-optical disk 10 which functions as an optically recording medium and which is rotated by a spindle motor(not shown). Further, 2 denotes an optical head 2 which irradiates an optical beam to the predetermined position on the magneto-optical disk 10 for recording/reproducing operations. The optical head 2 is adapted to be driven by another motor(not shown) so as to move with respect to the radial direction of the magneto-optical disk 10, and to perform a seek operation for the predetermined track position.

In regard to the configuration on the surface of the magneto-optical disk 10, a plurality of tracks for recording information are formed between adjoining guide grooves. Further, both of a tracking position-error and a focusing position-error are obtained by utilizing the reflected optical beam, which is reflected from the magneto-optical disk 10 and goes back to an optical head 2 when an optical beam of the optical head 2 is irradiated to the magneto-optical disk 10.

To be more specific, a tracking position-error signal TES is generated on the basis of the reflected optical beam, and the tracking position-error of the optical beam corresponding to such a tracking servo-error signal TES is output. Further, taking into consideration the tracking position-error, a track control circuit(not shown) is adapted to control the optical head 2 to accurately irradiate the predetermined track for recording/reproducing operations.

In a similar manner, a focusing servo-error signal FES is generated on the basis of the reflected optical beam, and the focusing position-error of the optical beam corresponding to such a focusing servo-error signal FES is output. Further, taking into consideration the focusing position-error, a focusing control circuit(not shown) is adapted to control the optical head 2 so that a focus of the optical beam can accurately conform to the desired track position.

Further, in the optical head 2, the beam emitted from a semiconductor laser 20 is collected by a collimator lens 21. Then, the collected beam is reflected by a reflection mirror 23, through a beam-splitting prism 22 for splitting the beam into a polarized beam, and collected by an objective(also referred to as an actuator) 24, and irradiated to the surface of the magneto-optical disk 10.

At this time, the magnetizing force is given to the irradiated track of the magneto-optical disk 10 by a magnet 30 which is arranged confronting with the magneto-optical disk 10, and write/read/erase operations on the predetermined track of the magneto-optical disk 10 can be performed.

Further, the reflected optical beam from the magneto-optical disk 10 is collected by the objective 24, and reflected by the beam-splitting prism 22, through the reflection mirror 23. Further, the reflected optical beam from the prism 22 is collected by another collimator lens 26, through a half-wavelength plate 25, and irradiated to both of a tracking photo-detector 29 of two-divisional type and focusing photo-detector 28 of two-divisional type, through another beam-splitting prism 22.

The tracking photo-detector 29 of two-divisional type are constituted by two divided portions so that the moving amount of the optical beam(the hatched portion in FIG. 1(B)) with respect to the radial direction of the track on the surface of the magneto-optical disk 10 can be detected, as shown in FIG. 1(B). Further, in FIGS. 1(A) and 1(B), the respective output terminals of the two divided portions of the tracking photo-detector 29 are connected to a tracking servo-error signal generating circuit 4a. Further, the tracking servo-error signal generating circuit 4a calculates the value of difference between the respective detection levels A, B of the two output terminals of the tracking photo-detector 29, and consequently outputs the tracking servo-error signal TES corresponding to this calculated value of difference.

Further, as shown in FIG. 1(B), the focusing photo-detector 28 of two-divisional type are also constituted by two divided portions. The respective output terminals of the two divided portions of the focusing tracking photo-detector 28 are connected to a focusing servo-error signal generating circuit 4b. Further, the focusing servo-error signal generating circuit 4b calculates the value of difference between the respective detection levels C, D of the two output terminals of the focusing photo-detector 29, and consequently outputs the focusing servo-error signal FES corresponding to this calculated value of difference.

As described above, in the example of FIG. 1(B), two kinds of photo-detectors 28, 29 of two-divisional type are utilized for detecting the tracking position-error and the focusing position-error.

However, as shown in FIG. 1(C), it is also possible for one photo-detector of four-divisional type to be utilized, in place of the two photo-detectors of two-divisional type as in FIG. 1(B). In this case, by means of only one photo-detector of four-divisional type, the tracking servo-error signal TES can be obtained by calculating (A+C)−(B+D), and also the focusing servo-error signal FES is obtained by calculating (A+B)−(C+D).

In such servo-error signal generating circuits as represented by the above-mentioned tracking servo-error signal generating circuit 4a and focusing servo-error signal generating circuit 4b, the respective optical powers of the optical beams utilized in write operations, read operations and erase operations for the magneto-optical disk 10 are usually different from each other. Accordingly, the different photo-current, i.e., different detection current, flows in each of the photo-detectors 28, 29 at every write/read/erase operation, in accordance with the the corresponding optical power of the optical beam. Furthermore, the medium reflection factors of the individual tracks on the magneto-optical disk 10 are also different from each other. Therefore, to obtain assuredly the above-mentioned servo-error signals each adjusted to have a constant amplitude, it is necessary for AGC for the servo-error signals to be executed in the servo-error signal generating circuit.

To perform such an AGC assuredly, the following AGC operation must be usually executed for the detection currents detected by the photo-detectors.

First, two kinds of detection currents from each of the photo-detectors are added together, and then a sum signal is obtained.

Second, ore kind of the detection current from each of the photo-detectors is subtracted from another kind of the detection current therefrom, and then a difference signal is obtained.

Third, the above-mentioned sum signal is divided by the above-mentioned difference signal.

Consequently, both of the tracking servo-error signal and focusing servo-error signal, each having a constant amplitude, can be always obtained.

FIG. 2 is a circuit diagram showing a servo-error signal generating circuit of the prior art in the case where a photo-detector of two-divisional type is utilized. In this case, either one of the tracking servo-error signal generating circuit and focusing servo-error signal generating circuit will be illustrated representatively.

In FIG. 2, resistors R1, R2 are connected to the respectively corresponding photo-detector units P1, P2 in the photo-detector of two-divisional type. Further, each detection current is converted to the corresponding voltage (detection voltage), and the thus converted voltage is input to each base of two transistors T5, T6. Further, these voltages are added together by an operational amplifier 11, and a level-shift operation for a sum of these voltages is performed by an operational amplifier 13. Further, the sum of the voltages is input to the common base of two transistors T2, T3 in a multiplier circuit of Gilbert type.

In this multiplier circuit, the other two transistors T1, T4 are provided, the respective bases of which bias voltages of direct current type(also referred to as d.c. bias voltages) VR are applied to, and the respective collectors of which are connected to a power supply of the voltage Vcc, via resistors R5, R6. Further, the respective collectors of the transistors T2, T3 are coupled together and directly connected to the power supply of the voltage Vcc as the common collector. An emitter of the transistor T2 is connected to an emitter of the transistor T1 as the common emitter, while an emitter of the transistor T3 is connected to an emitter of the transistor T4 as the common emitter. Further, the respective emitters of drive transistors T5, T6 are connected to the corresponding constant current source 5a, 5b, via resistors R7, R8.

Between a node of the resistor R7 and the constant current source 5a and another node of the resistor R8 and the constant current source 5b, a resistor R9 is connected. This resistor R9 is adapted to convert the differential voltage X−Y as mentioned below to the corresponding differential current which flows through the drive transistors T5, T6.

In this case, when the detection voltages of the two photo-detector units P1, P2, is respectively X, Y, corresponding to the detection levels A, B, the voltage of the collector of the transistor T1 becomes {(X+Y)−X}/(X+Y), i.e., Y/(X+Y). On the other hand, the voltage of the collector of the transistor T4 becomes {(X+Y)−Y}/(X+Y), i.e., X/(X+Y). Therefore, the difference between the respective collectors of the transistors T1, T4 becomes (X−Y)/(X+Y); Namely, the difference signal corresponding to the value of X−Y is divided by the sum signal corresponding to the value of X+Y. Further, if the difference (X−Y)/(X+Y) is input to an operational amplifier 12 to accurately calculate the difference between the respective collectors of the transistors T1, T4, the servo-error signal(TES or FES), in which the AGC operation as described before has been performed, can be finally obtained.

Here, Ic1 and VBE1 are assumed to be the collector current of the transistor T1 and the voltage between the base and the emitter thereof, respectively. Further, Ic2 and VBE2 are assumed to be the collector current of the transistor T2 and the voltage between the base and the emitter thereof, respectively. Further, Ic5 is assumed to be the collector current of the transistor T5. By these assumptions, the following equations are obtained.

$$Ic1 = Is \times \{\exp(q*VBE1/kT) - 1\}$$

$$Ic2 = Is \times \{\exp(q*VBE2/kT) - 1\}$$

$$Ic5 = Ic1 + Ic2$$

Where, q denotes an electric charge of an electron, T denotes an absolute temperature, k denotes a Boltzmann constant, and Is denotes a saturation current of a collector in the reverse direction.

Further, in the case where the condition represented by $\exp(q*VBE1/kT) \gg 1$ and $\exp(q*VBE1/kT) \gg 1$ is satisfied, the following equation is obtained.

$$Ic1 = Ic5/[1 + \exp\{q(VBE2 - VBE1)/kT\}]$$

Further, the respective currents detected by the photo-detectors P1, P2 are logarithmically converted by the operational amplifier 11, and then supplied to the common base of the transistors T2, T3 as the base voltage thereof. Therefore, the following equation is further obtained.

$$Ic1 = Ic5/\{1 + K*(X+Y)\}$$

Where, K denotes a proportional constant.

Further, in the case where the voltage VR is selected so that the condition represented by $K*(X+Y) \gg 1$ can be satisfied, the following equations are simultaneously obtained.

$$Ic1 = Ic5/K*(X+Y)$$

$$Ic4 = Ic6/K*(X+Y)$$

Where, Ic6 denotes the collector current of the transistor T6.

In this case, since Ic5 and Ic6 correspond to the respective output currents of a differential amplifier having the transistors T5, T6, it is apparent from the above-mentioned equations that Ic1−Ic4 is proportional to (X−Y)/(X+Y).

Further, the collector currents Ic5, Ic6 are converted to the corresponding voltages by the resistors R5, R6, respectively. Thereafter, these voltages are input to the operational amplifier 12. Finally, the differential signal taken out from the operational amplifier 12 can be the tracking servo-error signal TES or the focusing servo-error signal FES, which has a constant amplitude independent of the change of the amount of optical beam.

FIG. 3 is a circuit diagram showing a servo-error signal generating circuit of the prior art in the case where a photo-detector of four-divisional type is utilized. In this case, only the focusing servo-error signal generating circuit will be illustrated as the representative of the servo-error signal generating circuits. Hereinafter, any component that is the same as that mentioned before will be referred to using the same reference number.

In FIG. 3, resistors R41, R42, R43 and R44 are connected to the respectively corresponding photo-detector units P41, P42, P43 and P44 in the photo-detector of four-divisional type. Further, the detection currents of the respective photo-detector units P41, P42, P43 and P44 are respectively converted to the detection voltages A4, B4, C4 and D4, corresponding to the detection levels A, B, C and D illustrated in FIG. 1(C).

The two detection voltages A4, B4 are added together by an operational amplifier 14 including the predetermined external resistors r1, r2 and r3. On the other hand, the remaining two detection voltages C4, D4 are also added together by an operational amplifier 15 including the predetermined external resistors r4, r5 and r6. Two kinds of sums A4+B4 and C4+D4 respectively taken out from the amplifiers 15, 16 are input to the corresponding bases of two transistors T5, T6 in a multiplier circuit having the same circuit configuration as in FIG. 2. Further, the four detection voltages A4, B4, C4 and D4 are added together by an operational amplifier 11 including the predetermined external resistors r7, r8, r9, r10 and r11, and a level-shift operation for a sum A4+B4+C4+D4 of all these voltages is performed by an operational amplifier 13 including the predetermined external resistors r12, r13, r14 and r15. Further, the sum A4+B4+C4+D4 is input to the common base of two transistors T2, T3 in the above-mentioned multiplier circuit.

Further, in a similar manner to the case of FIG. 2, the voltage of the collector of the transistor T1 becomes {(A4+B4+C4+D4)−(A4+B4)}/(A4+B4+C4+D4), i.e., (C4+D4)/(A4+B4+C4+D4). On the other hand, the voltage of the collector of the transistor T4 becomes {(A4+B4+C4+D4)−(C4+D4)}/(A4+B4+C4+D4), i.e., (A4+B4)/(A4+B4+C4+D4). Therefore, the difference between the respective collectors of the transistors T1, T4 becomes {(A4+B4)−(C4+D4)}/(A4+B4+C4+D4); Namely, the difference signal corresponding to the value of (A4+B4)−(C4+D4) is divided by the sum signal corresponding to the value of (A4+B4+C4+D4). Further, if the difference {(A4+B4)−(C4+D4)} (A4+B4+C4+D4) is input to an operational amplifier 12 to accurately calculate the difference between the respective collectors of the transistors T1, T4, the focusing servo-error signal FES, in which the AGC operation as described before has been performed, can be finally obtained.

Further, if other operational amplifiers and another multiplier circuit, respectively having the same configuration as the above-mentioned amplifiers 12, 14 and 15 and the above-mentioned multiplier circuit of Gilbert type, are provided, it becomes also possible for the tracking servo-error signal TES to be obtained.

However, in the positioning control system including the servo-error signal generating circuit according to the prior art as illustrated in FIG. 2 or FIG. 3, the following problems have occurred.

First, such a servo-error signal generating circuit is mainly constituted by an AGC circuit of the voltage-operation type, in which the detection currents in the photo-detectors have to be converted to the voltage utilized as the servo-error signal. Therefore, it becomes necessary for the circuit to have a lot of resistors and a lot of operational amplifiers in converting the detection currents to the useful voltages. Consequently, the circuit per se is likely to have the complicated configuration, and to be easily affected by external noises.

Second, the circuit has a lot of transistors connected in multi-stage configuration. Therefore, it becomes difficult for the levels of all the transistors to be normally distributed, and also it becomes difficult for the operating points of all the transistors to be accurately determined. Consequently, all the transistors can not be driven by a single power supply.

Third, it is difficult for the circuit including such operational amplifiers and the related resistors to be realized by an IC, which can provide the desired circuit with a small size and in relatively low cost for fabrication.

SUMMARY OF THE INVENTION

In view of the the above-mentioned problems, the main object of the present invention is to provide a positioning control system utilizing an optical beam which includes a servo-error signal generating circuit having simpler circuit configuration than that in the prior art.

A further object of the present invention is to provide a positioning control system utilizing an optical beam which includes a servo-error signal generating circuit that is not affected by external noises and that can utilize a single power supply.

A still further object of the present invention is to provide a positioning control system utilizing an optical beam which can be incorporated into an IC that realize the desired circuit with a small size and in relatively low cost for fabrication.

A still further object of the present invention is to provide a positioning control system utilizing an optical beam which can be applied to a magneto-optical disk device having an optical head and a magneto-optical disk for recording/reproducing operations.

A still further object of the present invention is to provide a positioning control system utilizing an optical beam which can be applied to an optical disk device having an optical head and an optical disk for recording/reproducing operations.

To attain the above objects, the positioning control system utilizing an optical beam according to the present invention has a photo-detector constituted by at least two-divisional photo-detector units; and a servo-error signal generating circuit which can generate at least one servo-error signal for servo control of the optical beam in accordance with a difference between the respective detection currents detected by the photo-detector units.

Further, the servo-error signal generating circuit includes at least one division circuit that has two pairs of transistors, two emitters in each pair of transistors being connected together into a common emitter, d.c. bias voltages being applied to the respective bases corresponding to transistors on one side in the respective pairs of transistors, the respective collectors corresponding to the transistors on one side being connected to a common connecting portion via resistors, the common connecting portion being connected to a power supply, the respective bases corresponding to transistors on the other side being connected together into a common base.

Further, an integrating capacitor is connected to the common base corresponding to the transistors on the other side, and integrates a difference between the current equivalent to the current flowing through the above-mentioned common connecting portion and the predetermined reference current, to apply the thus integrated difference to the common base of the transistors on the other side.

Further, the photo-detector units are respectively connected to the common emitters of the respective pairs of the transistors, so that the respective detection currents can flow through the common emitters.

Further, the division circuit is adapted to obtain the servo-error signal from the respective potentials of the respective collectors of the transistors on one side.

Preferably, the common connecting portion is connected to the power supply via a current-mirror circuit. The integrating capacitor is operative to integrate a difference between the mirror current in the current-mirror circuit and the reference current.

In such a construction, since the detection currents detected by the respective photo-detectors can be directly input to the division circuit, it is not necessary for a lot of resistors and operational amplifiers to be provided. Therefore, the servo-error signal generating circuit in the positioning control system can be realized by an integrated circuit.

Further, preferably, the photo-detector units are connected to the common emitters in the respective pairs of the transistors via a plurality of current-mirror circuits.

In the case where four-divisional photo-detector units are connected to a plurality of division circuits, the division circuits are operative to obtain both of a tracking servo-error signal for tracking servo control and a focusing servo-error signal for focusing servo control.

In an alternative preferred embodiment, the positioning control system according to the present invention includes a servo-error signal generating circuit which has two pairs of transistors, two bases in each pair of the two pairs of transistors being connected together into a common base, the respective collectors corresponding to the transistors on one side in the respective pairs of transistors being connected to a common connecting portion via corresponding resistors, the common connecting portion being connected to a power supply, the respective emitters corresponding to the transistors on one side being connected together to a constant current source.

Further, at least two photo-detector units are connected to the respective collectors corresponding to transistors on the other side, so that the respective detection currents can flow through the respective collectors corresponding to the transistors on the other side, and the respective emitters corresponding to the transistors on the other side are connected together into a common emitter.

In this case, the positioning control system is adapted to control an amplitude of the servo-error signal on the basis of the current generated in the constant current source. By virtue of such a constant current source, the positioning control system can be realized without an integrating capacitor for preventing the system from causing an oscillation. Therefore, it can be easier to realize the servo-error signal generating circuit by an integrated circuit.

In another alternative preferred embodiment, a servo-error signal generating circuit includes two pairs of current-mirror circuits in which the respective bases of a plurality of first transistors and the respective bases of a plurality of second transistors are connected together, and a base and a collector of each of the first transistors are connected together; a first voltage source which is connected in common to the respective emitters of the first transistors; a current source which is connected in common to the respective emitters of the second transistors; two-divisional photo-detector units which have first terminals connected in common to a second voltage source, and have second terminals connected to the respective collectors of the first transistors, to detect the return optical beam; and two resistors which have first terminals connected to the respective collectors of the second transistors, and have second terminals connected in common to a second voltage source.

Typically, the positioning control system according to the present invention can applied to a magneto-optical disk device, which includes a magneto-optical disk that functions as the optically recording medium and an optical head which irradiates the optical beam to the predetermined position on the magneto-optical disk.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Figure 4A:
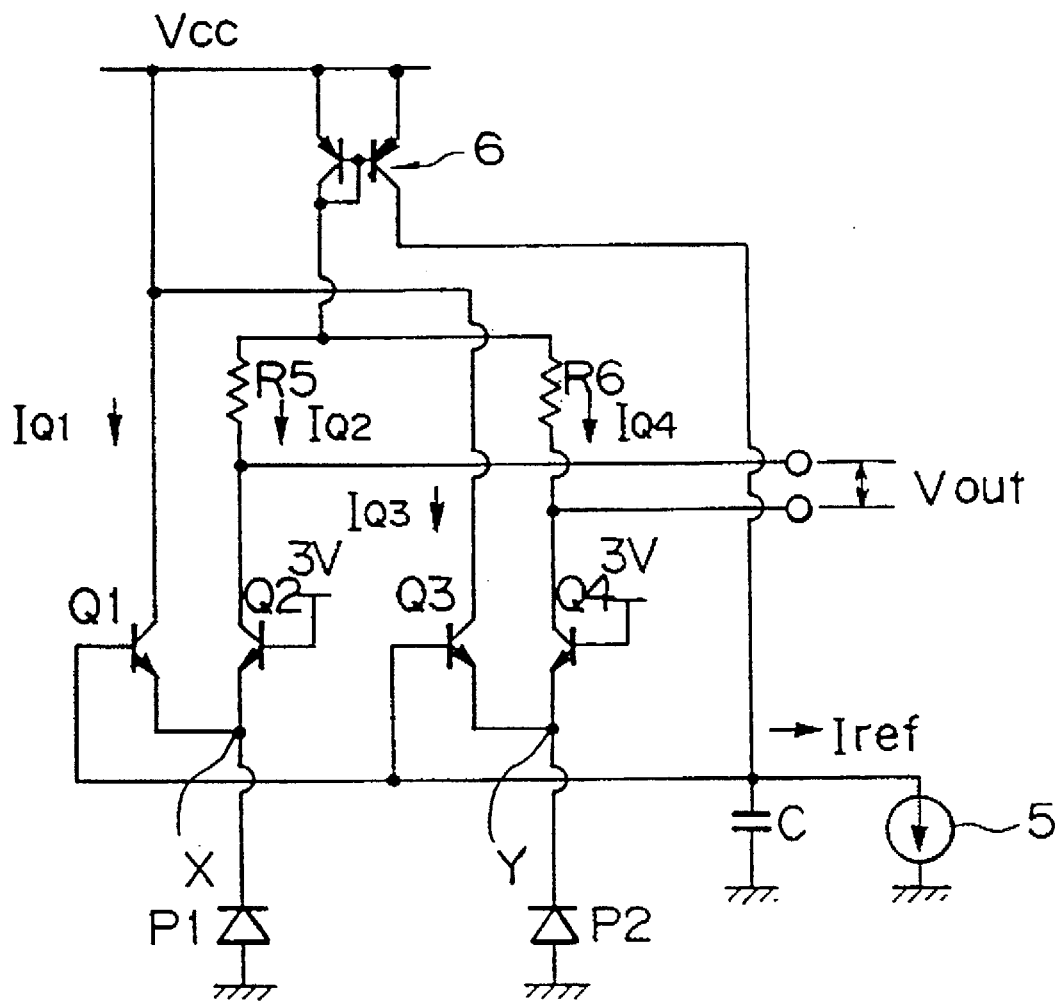
FIGS. 4(A) and 4(B) are essential embodiments each based on the principle of the present invention.
Figure 4B:
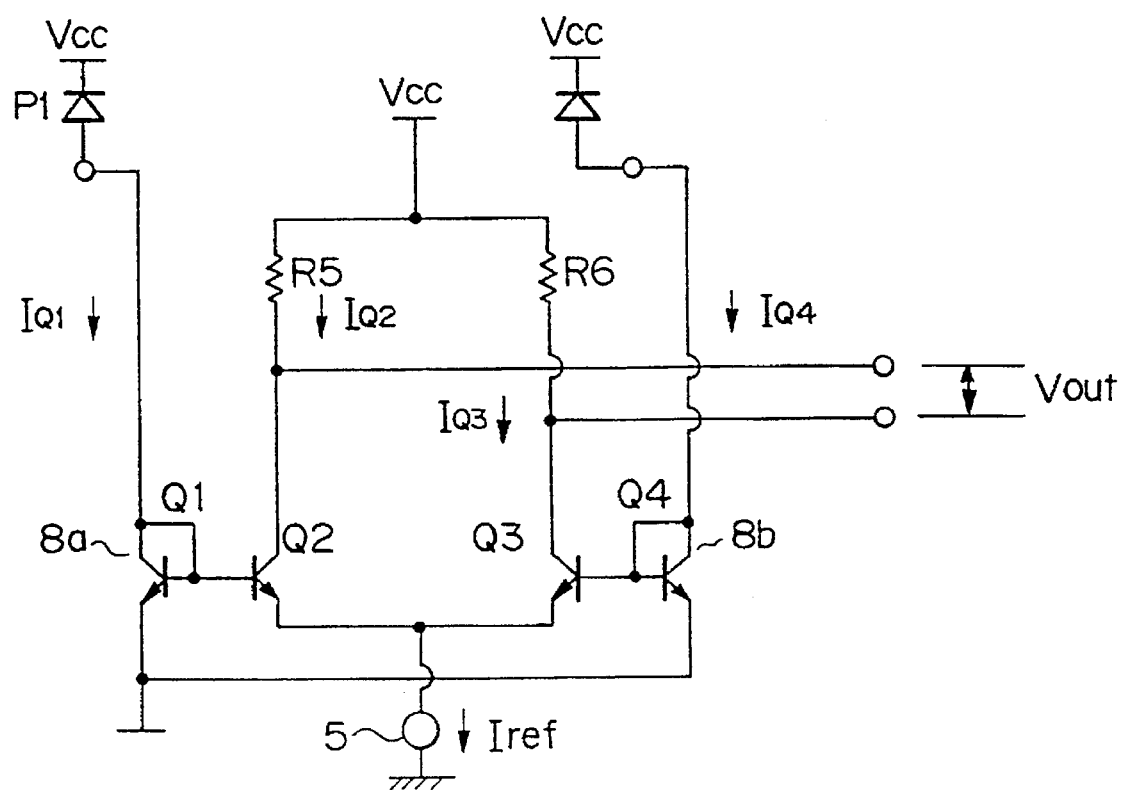

FIGS. 4(A) and 4(B) are circuits each showing an essential embodiment of a positioning control system based on the principle of the present invention. To be more specific, FIG. 4(A) shows an embodiment based on the first principle; and FIG. 4(B) shows another embodiment based on the second principle. In this case, the servo-error signal generating circuit, which is the main part of a positioning control system of the present invention is illustrated representatively to simplify the explanation.

Hereinafter, it should be noted that the positioning control system includes both of the tracking servo control and the focusing servo control as described before.

In FIG. 4(A), a photo-detector is constituted by two-divisional photo-detector units P1, P2 for detecting the return optical beam reflected from a recording medium(not shown). Further, a servo-error signal generating circuit is provided, which can generate at least one servo-error signal for servo control of the optical beam in accordance with a difference between the respective detection currents detected by the photo-detector units P1, P2, so as to accurately irradiate an original optical beam to the desired position on the basis of the servo-error signal.

Such a servo-error signal generating circuit includes a division circuit that has two pairs of transistors Q1~Q4. Two emitters in each pair of the two pairs of transistors Q1~Q4 are connected together into a common emitter. Further, d.c. bias voltages(e.g., 3 V) are applied to the respective bases corresponding to transistors Q2, Q4 on one side in the respective pairs of transistors Q1~Q4. Further, the respective collectors corresponding to the transistors Q2, Q4 on one side in the respective pairs of transistors Q1~Q4 are connected to the corresponding resistors R5, R6 through which the currents IQ2, IQ4 respectively flow, and coupled together into a common connecting portion so as to connect to a power supply of the voltage Vcc. Further, the respective bases corresponding to transistors Q1, Q3 on the other side in the respective pairs of transistors, through which the currents IQ1, IQ3 respectively flow, are connected together into a common base.

Further, an integrating capacitor C is connected to the common base corresponding to the transistors Q1, Q3 on the other side. The integrating capacitor C is adapted to integrate a difference between the current equivalent to the current flowing through the common connecting portion of the respective collectors and the predetermined reference current Iref generated by a constant current source 5, to apply the thus integrated difference to the common base corresponding to the transistors Q1, Q3 on the other side.

Further, the photo-detector units P1, P2 are respectively connected to the common emitters in the respective pairs of the transistors Q1~Q4, so that the respective detection currents can flow through the common emitters. Further, the division circuit takes out the servo-error signal as the output voltage Vout from the respective potentials of the respective collectors of the transistors Q2, Q4 on one side.

Further, in FIG. 4(A), the common connecting portion of the respective collectors of the transistors Q2, Q4 is connected to the power supply via a current-mirror circuit 6. The integrating capacitor C is operative to integrate a difference between the mirror current generated in the current-mirror circuit 6 and the reference current Iref, and to execute a feedback operation by applying the thus integrated difference to the common base of the transistors Q1, Q3 on the other side.

Figure 1A:
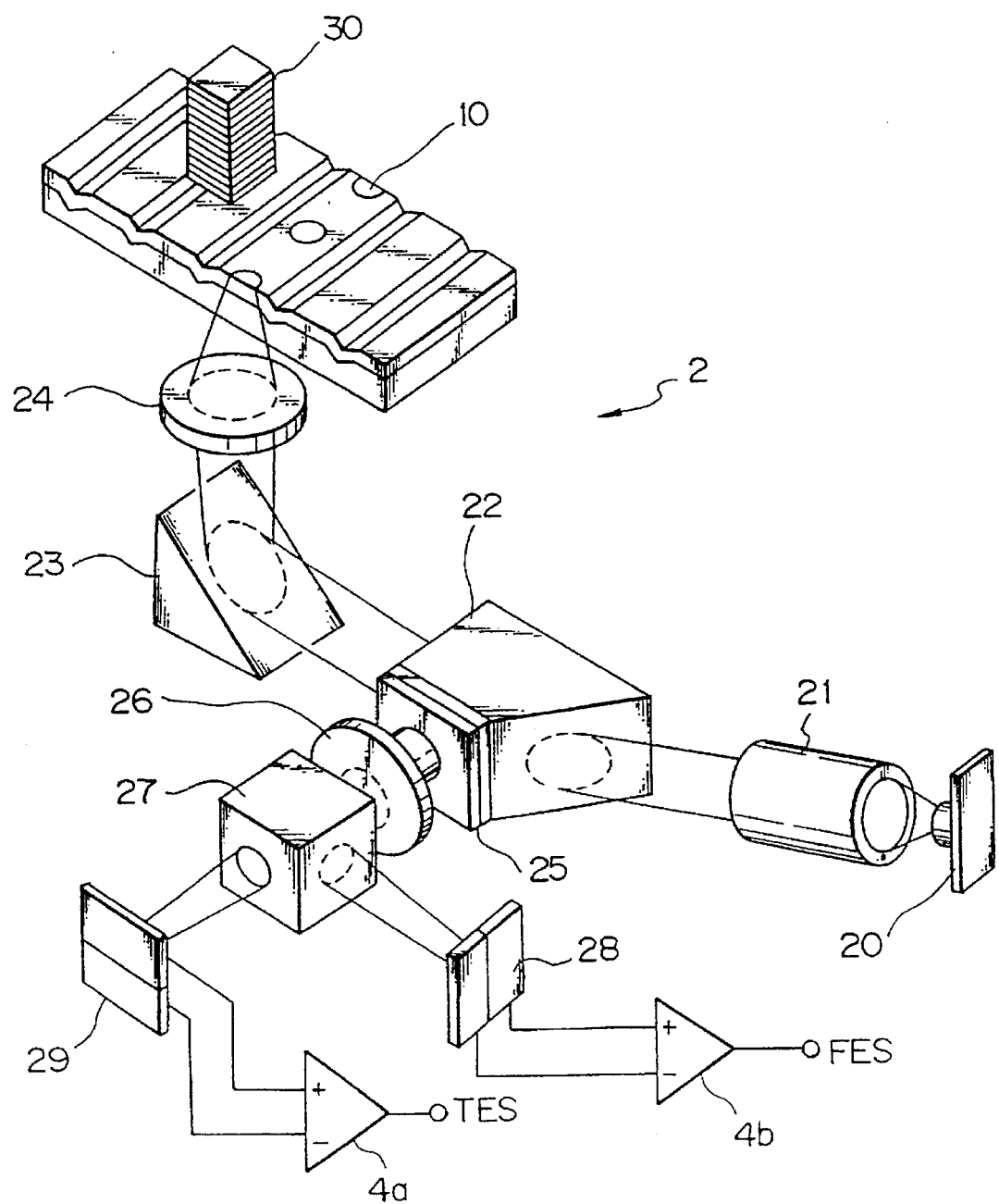
FIGS. 1(A), 1(B) and 1(C) are diagrams for explaining servo control operations for positioning control in a magneto-optical disk device.
Figure 1B:
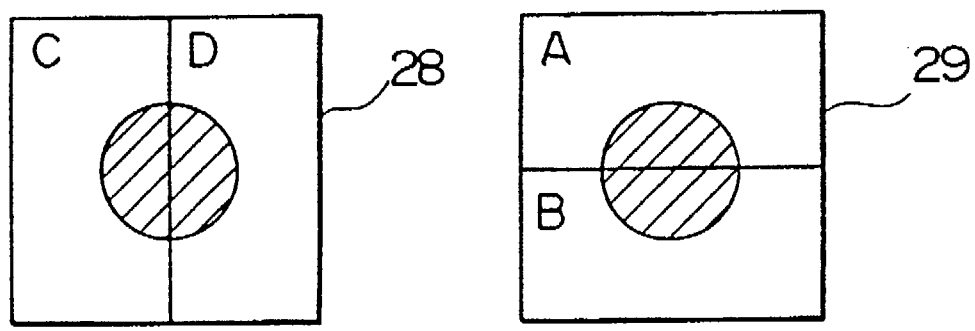
Figure 1C:
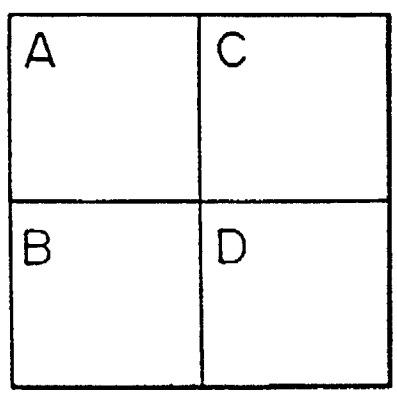
Figure 2:
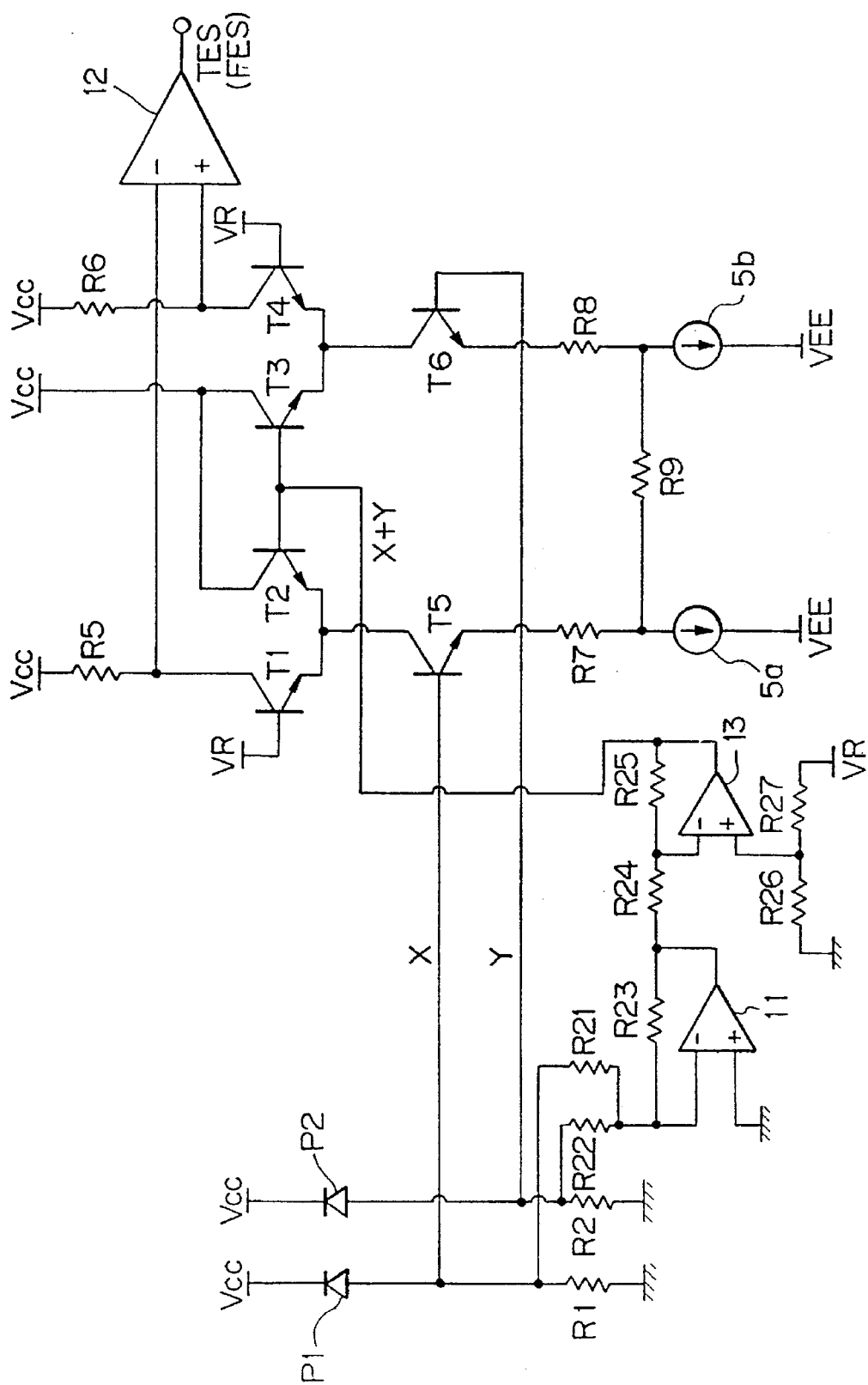
FIG. 2 is a circuit diagram showing a servo-error signal generating circuit of the prior art in the case where a photo-detector of two-divisional type is utilized.
Figure 3:
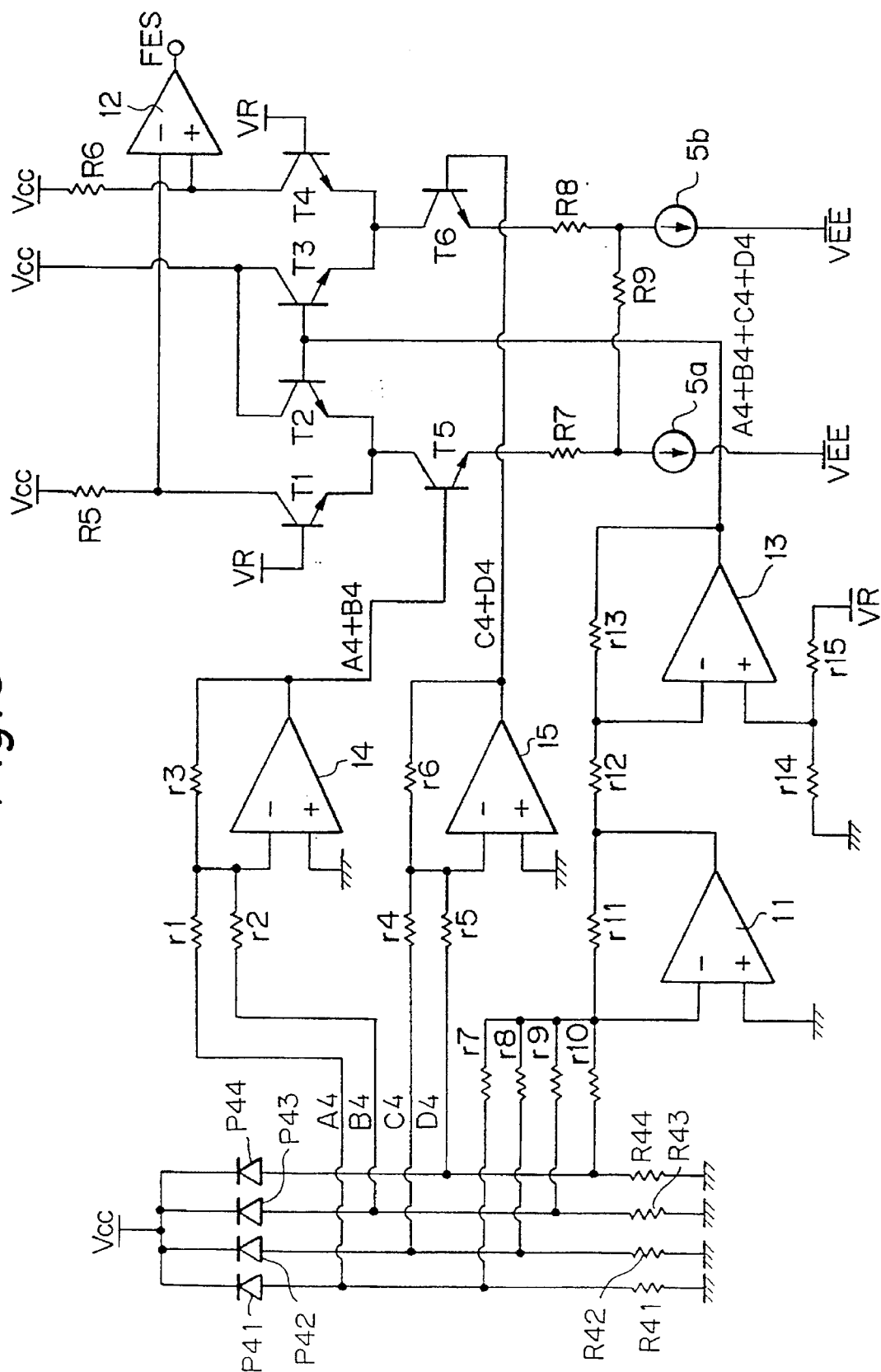
FIG. 3 is a circuit diagram showing a servo-error signal generating circuit of the prior art in the case where a photo-detector of four-divisional type is utilized.

In conceiving the essential embodiment according to the present invention as represented by FIG. 1(A), a special attention was paid to the disadvantage of the prior art that the servo-error signal generating circuit is mainly constituted by an AGC circuit of the voltage-operation type and requires a lot of resistors and operational amplifiers. To cope with this disadvantage, an AGC circuit of current operation mode, which has the simpler construction, easily realized by an IC, and not affected by external noises, is utilized for the present invention.

To be more concrete, the sequences for obtaining the servo-error signal in FIG. 4(A) are as follows:

First, the difference between the current equivalent to the current flowing through the common connecting portion and the reference current Iref is integrated and converted to the corresponding voltage by the integrating capacitor C;

Second, this voltage is input to the common base of the transistors Q1, Q3 on the other side by a feedback operation;

Third, the detection currents respectively flow through the photo-detector units P1, P2 which are connected to the common emitters in the respective pairs of the transistors Q1~Q4; and Fourthly, the output voltage Vout is finally taken out from the respective potentials of the respective collectors of the transistors Q2, Q4 on one side, as the servo-error signal of the voltage (X−Y)/(X+Y).

In such sequences, an AGC circuit of current operation mode, in which a lot of resistors, etc., for converting the detection currents to the detection voltages need not be provided, is utilized for an AGC operation. Therefore, the circuit configuration becomes simpler than in the prior art, and it becomes possible for the AGC circuit to be realized by an IC.

Further, in the case where the common connecting portion of the respective collectors of the transistors Q2, Q4 is connected to the power supply via a current-mirror circuit 6, the integrating capacitor C integrates a difference between the mirror current in the current-mirror circuit and the reference current Iref, and converts the difference to the corresponding voltage. In such a construction, this voltage proportional to X+Y can be input to the common base of the transistors Q1, Q3 by a feedback operation, without a loss of electric power due to resistors.

In FIG. 4(B), a photo-detector is also constituted by two-divisional photo-detector units P1, P2, similar to the case of FIG. 4(A). Further, a servo-error signal generating circuit is also provided, which can generate at least one servo-error signal for servo control of the optical beam in accordance with a difference between the respective detection currents detected by the photo-detector units P1, P2.

Such a servo-error signal generating circuit also includes two pairs 8a, 8b of transistors Q1~Q4. Further, two bases in each pair of the two pairs 8a, 8b of transistors Q1~Q4 are connected together into a common base. Further, the respective collectors corresponding to the transistors Q2, Q3 on one side in the respective pairs 8a, 8b of transistors Q1~Q4, through the currents IQ2, IQ3 respectively flow, are connected to the corresponding resistors R5, R6 and coupled together into a common connecting portion so as to connect to a power supply of the voltage Vcc.

Further, the respective emitters of the transistors Q2, Q3 on one side are connected together to a constant current source 5.

Further, the photo-detector units P1, P2 are connected to the respective collectors corresponding to transistors Q1, Q4 on the other side in the respective pairs 8a, 8b of transistors Q1~Q4, so that the respective detection currents IQ1, IQ4 can flow through the respective collectors of the transistors Q1, Q4 on the other side. Further, the respective emitters of the transistors Q1, Q4 on one other side are connected together into a common emitter. Further, the servo-error signal generating circuit takes out the servo-error signal from the respective potentials of the respective collectors of the transistors Q2, Q3 on one side, similar to the case of FIG. 4(B).

In this case, the positioning control system is operative to control an amplitude of the servo-error signal on the basis of the current generated in the constant current source 5. Namely, an AGC circuit of current operation mode, which is not affected by external noises, is also utilized, in place of an AGC circuit of voltage operation mode as in the prior art.

To be more concrete, the sequences for obtaining the servo-error signal in FIG. 4(B) are as follows:

First, the detection currents respectively flow through the photo-detector units P1, P2 which are connected to the respective collectors of the transistors Q1, Q4 on the other side; and Second, the output voltage Vout is taken out from the respective potentials of the respective collectors of the transistors Q2, Q3 on one side, as the servo-error signal of the voltage (X−Y)/(X+Y).

In this case, since the feedback operation for the bases of transistors as described in FIG. 4(A) is not executed, the frequency characteristics of the positioning control system is not deteriorated due to such a feedback operation. Therefore, an integrating capacitor for stabilizing the system(shown in FIG. 4(A)) is not necessary. Consequently, the servo-error generating circuit in FIG. 4(B) becomes simpler than that in FIG. 4(A), and can be constituted more easily than that in FIG. 4(A).

Figure 5:
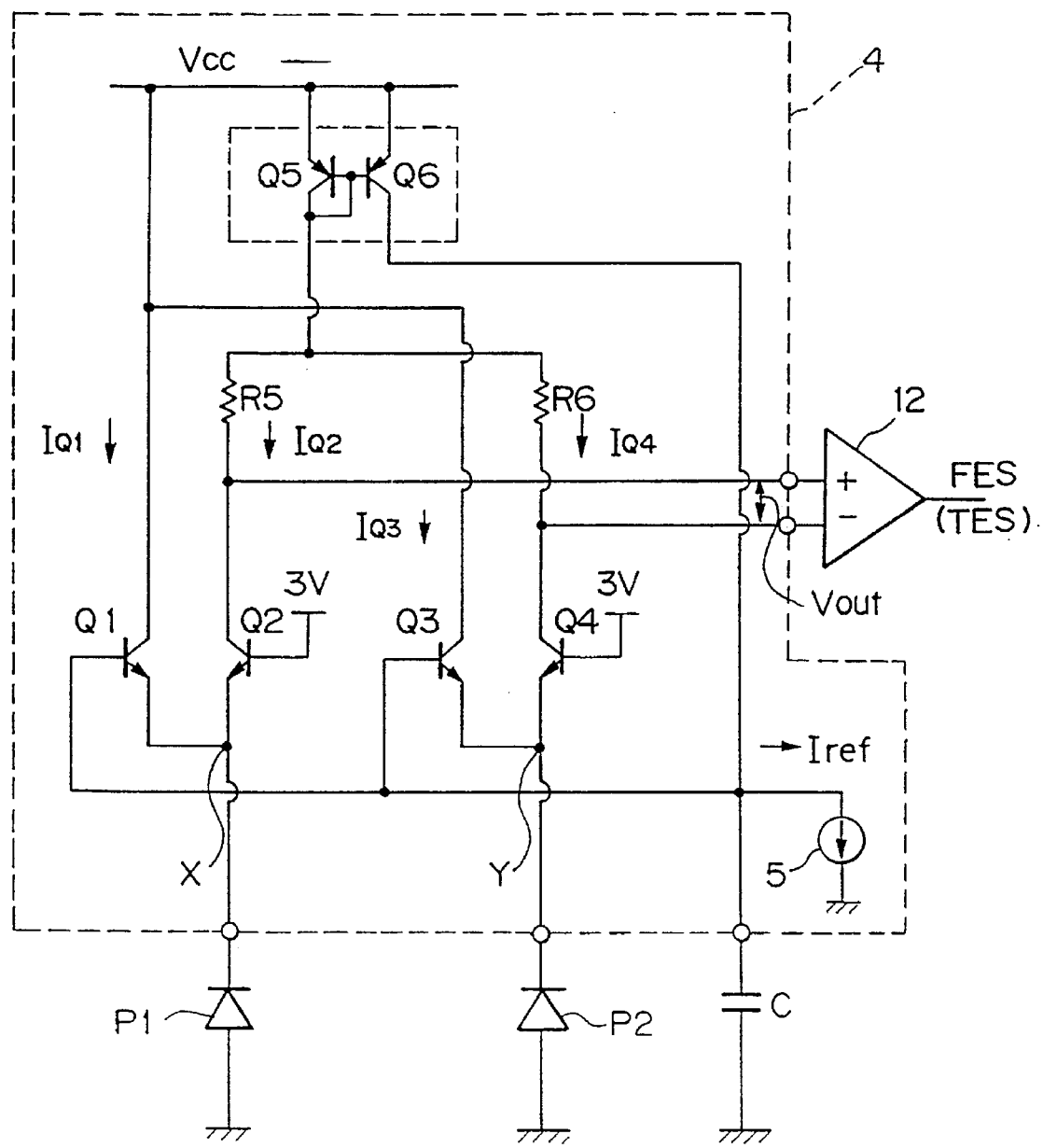
FIG. 5 is a circuit diagram showing a first preferred embodiment according to the present invention.

FIG. 5 is a circuit diagram showing a first preferred embodiment according to the present invention. In this case, a servo-error signal generating circuit, which is the main part of a positioning control system of the present invention, will be explained more concretely than in FIG. 4(A).

In FIG. 5, similar to the case of FIG. 4(A), a servo-error signal generating circuit includes a division circuit that has two pairs of transistors Q1~Q4. Two emitters in each pair of the two pairs of transistors Q1~Q4 are connected together into a common emitter. Further, d.c. bias voltages(e.g., 3 V) are applied to the respective bases corresponding to transistors Q2, Q4 on one side in the respective pairs of transistors Q1~Q4.

Further, the respective collectors corresponding to the transistors Q2, Q4 on one side in the respective pairs of transistors Q1~Q4 are connected to the corresponding resistors R5, R6 which have the same resistance values each other and through which the currents IQ2, IQ4 respectively flow. Further, the respective ends of resistors R5, R6 are coupled together into a common connecting portion and connected to a power supply of the voltage Vcc, via a current-mirror circuit 6.

A difference between the mirror current generated in the current-mirror circuit 6 and the reference current Iref is integrated by an integrating capacitor C, and the thus integrated value is input to the common base of the transistors Q1, Q3 on the other side to execute a feedback operation.

Here, such an integrating capacitor C is provided to perform a phase compensation of a feedback loop of the circuit and to prevent the circuit from causing an oscillation.

Further, an operational amplifier 12 is connected to the respective collectors of the transistors Q2, Q4 on one side. The operational amplifier 12 is operative to calculate a differential output voltage Vout between the respective potentials of the respective collectors of the transistors Q2, Q4 and to output the tracking servo-error signal TES or the tracking servo-error signal FES. Further, the photo-detectors of two-divisional type (corresponding to the tracking photo-detector 29 or the focusing photo-detector 28 shown in FIG. 1(A)) is constituted by two photo-detector units P1, P2. The respective anodes of these photo-detector units P1, P2 are connected to the ground, while the respective cathodes thereof are connected to the common emitters of the respective pairs of transistors Q1~Q4.

Further, the operation of the servo-error signal generating circuit in FIG. 5 will be described hereinafter.

Here, VBE is assumed to be the voltage between a base and an emitter of a transistor, and Ic is assumed to be the collector current. The relation between VBE and Ic is expressed by the following equation (1).

$$Ic = Is \times \{\exp(q*VBE/kT) - 1\} \quad (1)$$

Where, q denotes an electric charge of an electron, T denotes an absolute temperature, k denotes a Boltzmann constant, and Is denotes a saturation current of a collector in the reverse direction, as described before.

At the room temperature(e.g., 300° K.), if VBE is 0.1 V, the value of the term of an exponential function becomes 47.7; if VBE is 0.2 V, the value becomes 227.4; and if VBE is 0.6 V, the value becomes 11,700,000,000. Therefore, the condition represented by exp(q*VBE1/kT)>>1 is satisfied, and the equation(1) is approximately expressed by the following equation (2).

$$Ic = Is \times \{\exp(q^*VBE/kT)\} \quad (2)$$

When the equation(2) is applied to the circuit shown in FIG. 5, the respective collector currents IQ1, IQ2, IQ3 and IQ4 of the transistors Q1, Q2 Q3 and Q4 are expressed by the following equations(3A)~(3D).

$$IQ1 = Is \times \{\exp(q^*VBE1/kT)\} \quad (3A)$$

$$IQ2 = Is \times \{\exp(q^*VBE2/kT)\} \quad (3B)$$

$$IQ3 = Is \times \{\exp(q^*VBE3/kT)\} \quad (3C)$$

$$IQ4 = Is \times \{\exp(q^*VBE4/kT)\} \quad (3D)$$

When a ratio of IQ1 with respect to IQ2, corresponding to the ratio between the respective collector currents in the collectors Q1, Q2 in which the emitters are connected together, is taken, the following equation(4) is obtained.

$$IQ1/IQ2 = \exp\{q(VBE1-VBE2)/kT)\} \quad (4)$$

In a similar manner, When a ratio of IQ3 with respect to IQ4, corresponding to the ratio between the respective collector currents in the collectors Q3, Q4 in which the emitters are connected together, is taken, the following equation (5) is obtained.

$$IQ3/IQ4 = \exp\{q(VBE3-VBE4)/kT)\} \quad (5)$$

Since the value of (VBE1–VBE2) is equal to that of (VBE3–VBE4), i.e., VBE1–VBE2=VBE3–VBE4, the equation(4) conforms to the equation (5). Namely, the following equation (6) is obtained.

$$IQ1/IQ2 = IQ3/IQ4 = \alpha \quad (6)$$

Here, it is assumed that the feedback operation in the feedback loop is executed so that the value of (IQ2+IQ4) is equal to Iref, i.e., IQ2+IQ4=Iref.

Further, it is assumed that the following two relations are satisfied.

$$IQ1+IQ2 = X$$

$$IQ3+IQ4 = Y$$

In this case, the value of (X−Y)/(X+Y) corresponding to the servo-error signal is expressed by the following equation (7).

$$(X-Y)/(X+Y) = \{(IQ1+IQ2)-(IQ3+IQ4)\}/(IQ1+IQ2+IQ3+IQ4) \quad (7)$$

When the equation(6) is substituted into the equation (7) to eliminate IQ1, IQ3 from the latter equation (7), the following equation(8) is obtained.

$$\begin{aligned}(X-Y)/(X+Y) &= \{IQ2(\alpha+1) - IQ4(\alpha+1)\}/ \\ &\quad \{IQ2(\alpha+1) + IQ4(\alpha+1)\} \\ &= (IQ2-IQ4)/(IQ2+IQ4) \\ &= (IQ2-IQ4)/Iref \end{aligned} \quad (8)$$

Since the value of R5 is equal to that of R6, i.e., R5=R6=R, the output voltage Vout corresponding to the difference between the respective collectors of the transistors Q2, Q4 is expressed by the following equation(9).

$$Vout = R \times Iref \times (X-Y)/(X+Y) \quad (9)$$

Therefore, if an AGC operation is performed in current mode, the servo-error signal(tracking servo-error signal or focusing servo-error signal), corresponding to the difference between the detection currents in the photo-detector units P1, P2, can be generated assuredly.

The servo-error generating circuit including an AGC circuit of current operation mode is not affected by the external noises. Further, the above-mentioned circuit has the relatively simple configuration, and requires few stages of transistors and a small number of operational amplifier. Accordingly, the circuit can be driven by a single power supply. Therefore, the portion of FIG. 5 surrounded by the broken line can be realized by an IC with a small size and in low cost for fabrication.

In this case, it should be noted that an integrating capacitor must be attached to the circuit from the outside thereof, to perform the phase compensation for the feedback loop of the circuit.

Figure 6:
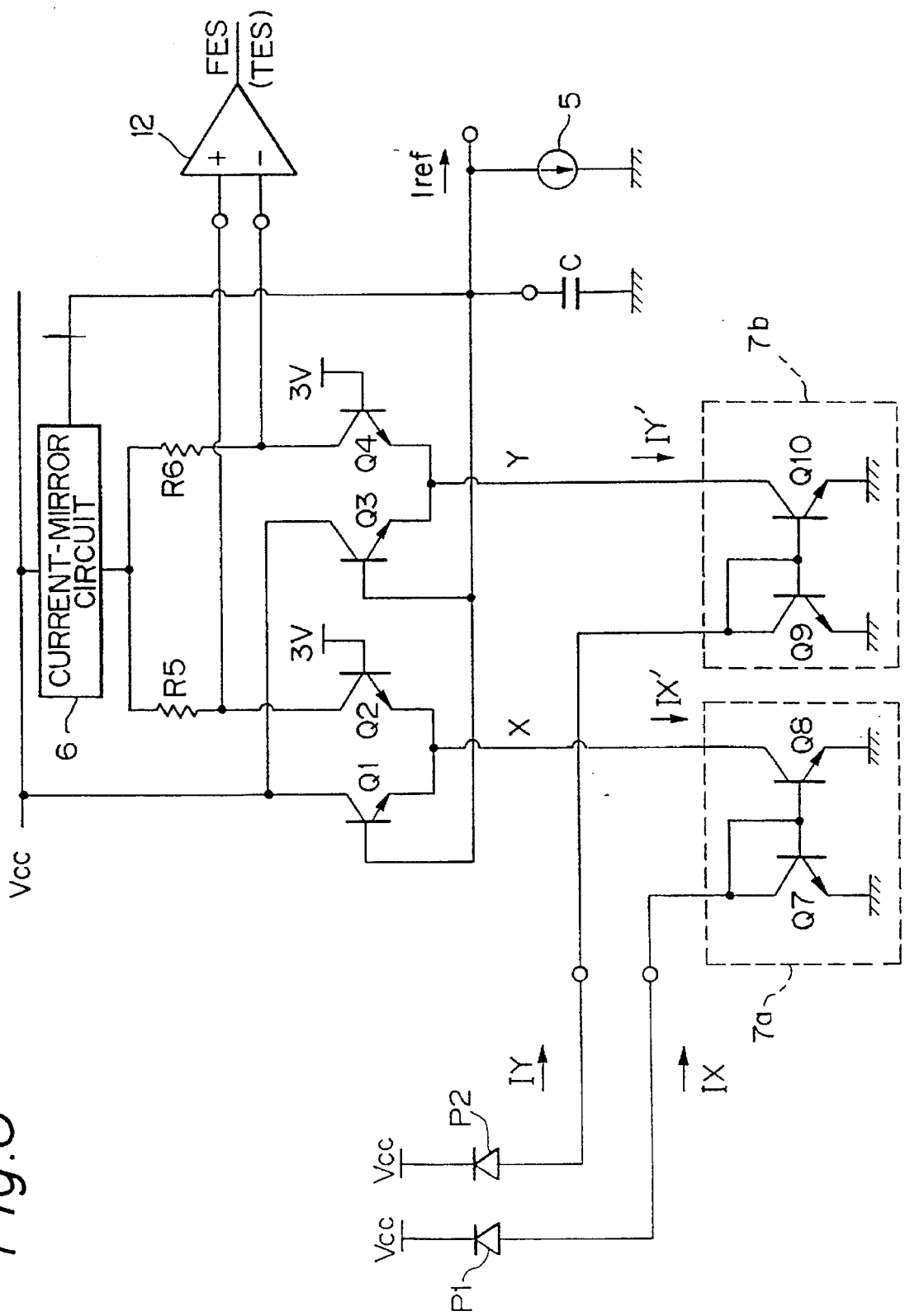
FIG. 6 is a circuit diagram showing a second preferred embodiment according to the present invention.

FIG. 6 is a circuit diagram showing a second preferred embodiment according to the present invention.

In this figure, a servo-error signal generating circuit, which is the main part of a positioning control system of the present invention, will be mainly illustrated.

In FIG. 6, both cathodes of photo-detector units P1, P2 are connected in common to a power supply of the voltage Vcc. Further, anodes of the photo-detector units P1, P2 are connected to a transistor Q7 of a current-mirror circuit 7a and a transistor Q9 of a current-mirror circuit 7b, respectively. Further, the respective collectors of another transistor Q8 of a current-mirror circuit 7a and a transistor Q10 of a current-mirror circuit 7b are connected to the respective common emitters of two pairs of transistors Q1~Q4 in the division circuit 4 as described in FIG. 5.

In such a circuit, the detection current Ix in the photo-detector unit P1 corresponds to the mirror current Ix' in the transistor Q8 of the current-mirror circuit 7a, while the detection current Iy in the photo-detector unit P2 corresponds to the mirror current Iy' in the transistor Q10 of the current-mirror circuit 7b. Therefore, the same operation as described in FIG. 5 can be performed, and the desired servo-error signal can be obtained.

In this case, by virtue of the current-mirror circuits 7a, 7b, the voltage Vcc of the power supply can be directly applied to the photo-detector units, respectively. Therefore, the voltage of the power supply can be utilized more effectively than the case of FIG. 5. Further, in the case where the current-multiplication factor is adjusted to the value that is equal to or more than 1, it becomes possible for the sensitivity of the photo-detector to be increased.

It should be noted that these current-mirror circuits 7a, 7b can be constituted by an IC, together with the other circuit portions.

Figure 7:
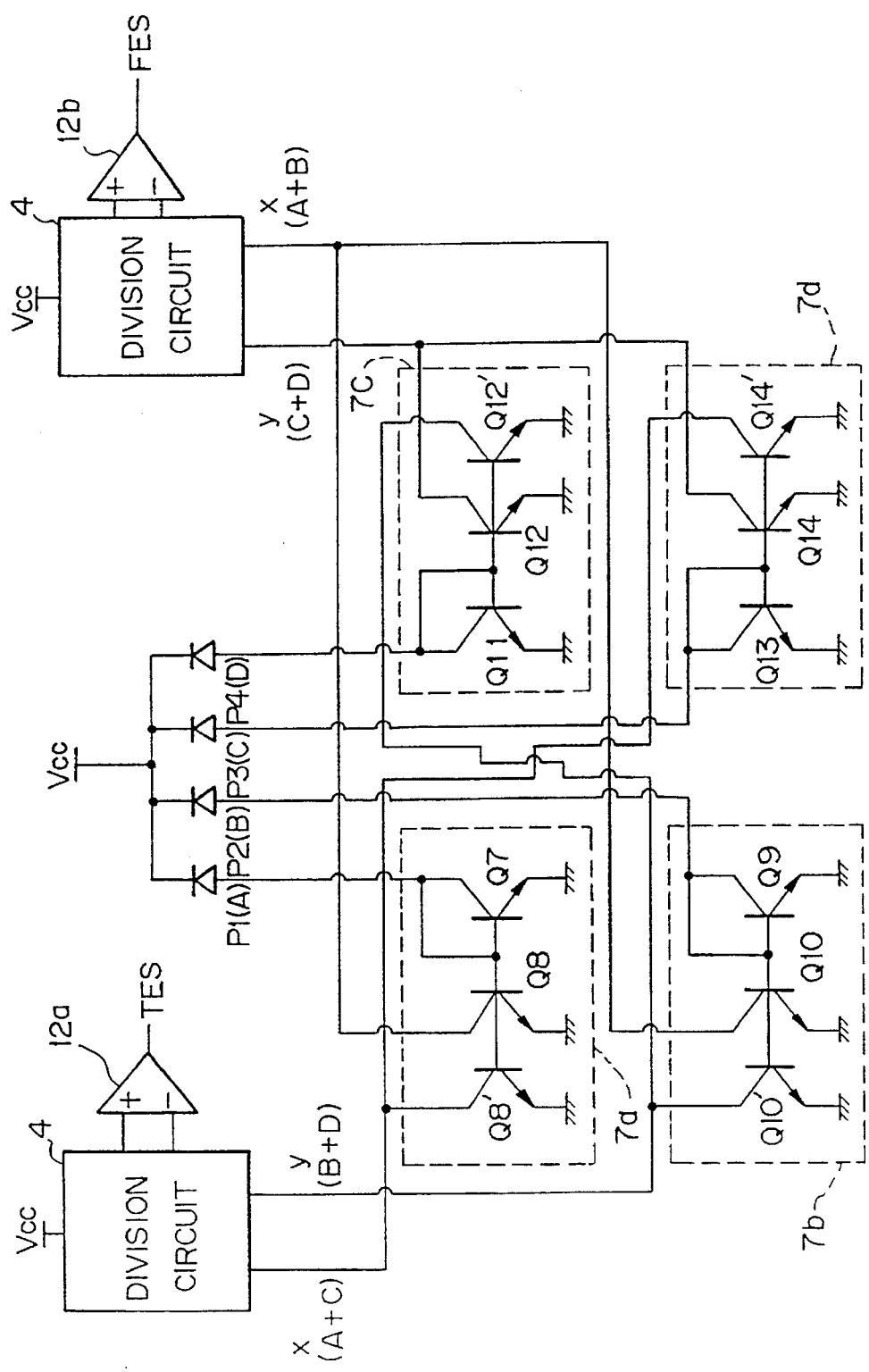
FIG. 7 is a circuit diagram showing a third preferred embodiment according to the present invention.

FIG. 7 is a circuit diagram showing a third preferred embodiment according to the present invention. Also in this figure, a servo-error signal generating circuit will be mainly illustrated.

In FIG. 7, four-divisional photo-detector units are utilized to simultaneously generate the tracking servo-error signal TES and the focusing servo-error signal FES. In this case, photo-detector units P1, P2, P3 and P4 are respectively connected to transistors Q7, Q9, Q11 and Q13 for servo control in the respective current-mirror circuit 7a~7d.

Further, the current-mirror circuits 7a~7d include the respective pairs of transistors Q8, Q8', Q10, Q10', Q12, Q12', and Q14, Q14' on the respective mirror sides thereof.

Further, a collector of the transistor Q8' of the current-mirror circuit 7a and a collector of the transistor Q14' of the current-mirror circuit 7d are connected in common to the sides x of the division circuit 4 (shown in FIG. 5) for tracking servo control. Further, the transistor Q10' of the current-mirror circuit 7b and the transistor Q12' of the current-mirror circuit 7c are connected in common to the sides y of the division circuit 4 for focusing servo control.

Further, a collector of the transistor Q8 of the current-mirror circuit 7a and a collector of the transistor Q10 of the current-mirror circuit 7b are connected in common to the sides x of the division circuit 4 for tracking servo control. Further, the transistor Q12 of the current-mirror circuit 7c and the transistor Q14 of the current-mirror circuit 7d are connected in common to the sides y of the division circuit 4 for focusing servo control.

Two operational amplifiers 12a, 12b are connected to the division circuit 4 for tracking servo control and the other division circuit 4 for focusing servo control, respectively. The operational amplifiers 12a, 12b output the tracking servo-error signal TES and the focusing servo-error signal FES, respectively.

In such a construction, the division circuit 4 for tracking servo control generates two kinds of output voltages corresponding to (A+C)/(A+B+C+D) and (B+D)/(A+B+C+D), with respect to the detection levels A~D respectively corresponding to the detection currents in the photo-detectors P1~P4. Further, a difference between the two kinds of output voltages are calculated by the operational amplifier 12a, and finally the tracking servo-error signal TES, for which an AGC operation is executed, can be obtained.

In a similar manner, the other division circuit 4 for focusing servo control generates two kinds of output voltages corresponding to (A+B)/(A+B+C+D) and (C+D)/(A+B+C+D), with respect to the detection levels A~D respectively corresponding to the detection currents in the photo-detectors P1~P4. Further, a difference between the two kinds of output voltages are calculated by the operational amplifier 12b, and finally the focusing servo-error signal FES, for which an AGC operation is executed, can be obtained.

It should be noted that these current-Mirror circuits 7a~7d can be constituted by an IC, together with the circuit shown in FIG. 5.

Figure 8:
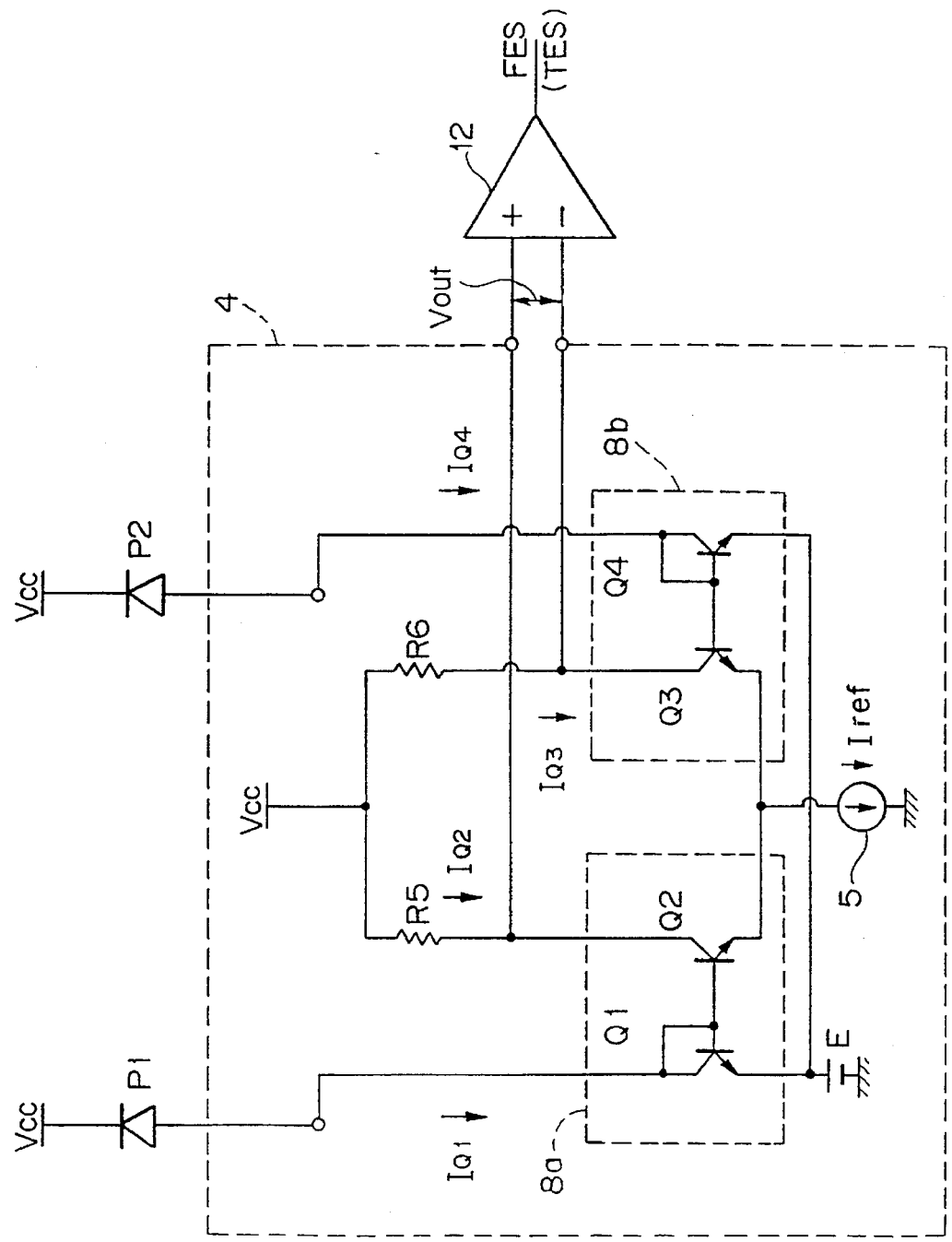
FIG. 8 is a circuit diagram showing a fourth preferred embodiment according to the present invention.

FIG. 8 is a circuit diagram showing a fourth preferred embodiment according to the present invention.. Also in this figure, a servo-error signal generating circuit will be mainly illustrated.

In FIG. 8, emitters of the respective transistors Q2, Q3 on one side of two pairs of transistors 8a, 8b are connected in common to a constant current source 5. Further, collectors of the respective transistors Q2, Q3 on one side are connected to a power supply of the voltage Vcc, via resistors R5, R6 having the same resistance values each other, respectively.

Further, in FIG. 8, emitters of the respective transistors Q1, Q4 on the other side of two pairs of transistors 8a, 8b are connected in common to the ground. Further, collectors of the respective transistors Q1, Q4 on the other side are respectively connected to anodes of photo-detector units in which both cathodes are connected to the power supply.

Further, the collectors of the respective transistors Q2, Q3 on one side are also connected to two input terminals of an operational amplifier 12, respectively.

Further, the operation of the servo-error signal generating circuit in FIG. 8 will be described hereinafter.

When the equation(3) described in the first preferred embodiment is transformed so that it is expressed in terms of VBE1~VBE4, the following equations (10A)~(10D) are obtained.

$$VBE1 = Vt \times \ln(IQ1/Is) \qquad (10A)$$

$$VBE2 = Vt \times \ln(IQ2/Is) \qquad (10B)$$

$$VBE3 = Vt \times \ln(IQ3/Is) \qquad (10C)$$

$$VBE4 = Vt \times \ln(IQ4/Is) \qquad (10D)$$

Where, it is assumed that the condition represented by Vt=kT/q is satisfied.

In these equations (10A)~(10D), ln(z) means log e(z)., natural logarithm, where z denotes any positive number.

By examining the relation between two transistors Q1, Q4 which are respectively connected to the photo-detectors P1, P4, the following equation(11) is obtained.

$$VBE1 - VBE4 = Vt \times \ln(IQ1/Is) - Vt \times \ln(IQ4/Is) \qquad (11)$$

By utilizing the property of the logarithm, the equation (11) is transformed into the following equation (12).

$$VBE1 - VBE4 = Vt \times \ln(IQ1/IQ4) \qquad (12)$$

In a similar manner, by examining the relation between two transistors Q2, Q3, the following equation(13) is obtained.

$$VBE2 - VBE3 = Vt \times \ln(IQ2/Is) - Vt \times \ln(IQ3/Is) \qquad (13)$$

By utilizing the property of the logarithm, the equation (13) is transformed into the following equation (14).

$$VBE2 - VBE3 = Vt \times \ln(IQ2/IQ3) \qquad (14)$$

In this case, since the value of (VBE1−VBE4) is equal to that of (VBE2−VBE3), i.e., VBE1−VBE4=VBE2−VBE3, the following equation(15) is obtained.

$$IQ1/IQ4 = IQ2/IQ3 = \alpha \qquad (15)$$

Further, since the transistors Q2, Q3 are both connected to the constant current source 5, the following equation(16) is obtained.

$$IQ2 + IQ3 = Iref = \text{constant} \qquad (16)$$

Further, the output voltage Vout corresponding to the difference between the respective collectors of the transistors Q2, Q3 is expressed by the following equation(17).

$$Vout = R \times (IQ2 - IQ3) \qquad (17)$$

In accordance with the equations (15), (16), it is confirmed that IQ2 is equal to the value of Iref* α/(α+1), i.e., IQ2=Iref*α/(α+1), and that IQ3 is equal to the value of Iref/(α+1), i.e., IQ3=Iref/(α+1).

By substituting these relations into the equation(17), the following equation(18) is obtained.

$$Vout = R \times Iref \times (\alpha - 1)/(\alpha + 1) \qquad (18)$$

Further, by utilizing the equation (15), it is confirmed that the value of (α−1) is equal to that of (IQ1/IQ4−1), i.e., (α−1)=IQ1/IQ4−1, and that the value of (α+1) is equal to that of (IQ1/IQ4+1), i.e., (α+1)=IQ1/IQ4+1. When these relations are substituted into the equation(18), the following equation(19) is obtained.

$$Vout = R \times (Iref \times (IQ1/IQ4 - 1)(IQ1/IQ4 + 1)) \qquad (19)$$
$$= R \times Iref \times (IQ1 - IQ4)/(IQ1 + IQ4)$$

As apparent from the equation(19), the value of quotient, in which a difference between the respective detection currents in the photo-detector P1, P2 is divided by a sum of the respective detection currents in the photo-detector P1, P2, is obtained as the output voltage Vout. This value corresponds to the servo-error signal for which an AGC operation is performed in current mode.

The servo-error generating circuit including an AGC circuit of current operation mode is not affected by the external noises. Further, the above-mentioned circuit has the relatively simple configuration, and requires few stages of transistors and a small number of operational amplifier. Accordingly, the circuit can be driven by a single power supply. Therefore, the portion of FIG. 8 surrounded by the broken line can be realized by an IC with a small size and in low cost for fabrication, similar to the case of FIGS. 5 to 7.

In this case, since the circuit has no feedback loop, an integrating capacitor is not necessary. Therefore, the frequency characteristics of the positioning control system is not deteriorated due to the feedback operation. Consequently, an operational amplifier 12 has only to be provided as the additional circuit provided outside the servo-error signal generating circuit.

Figure 9:
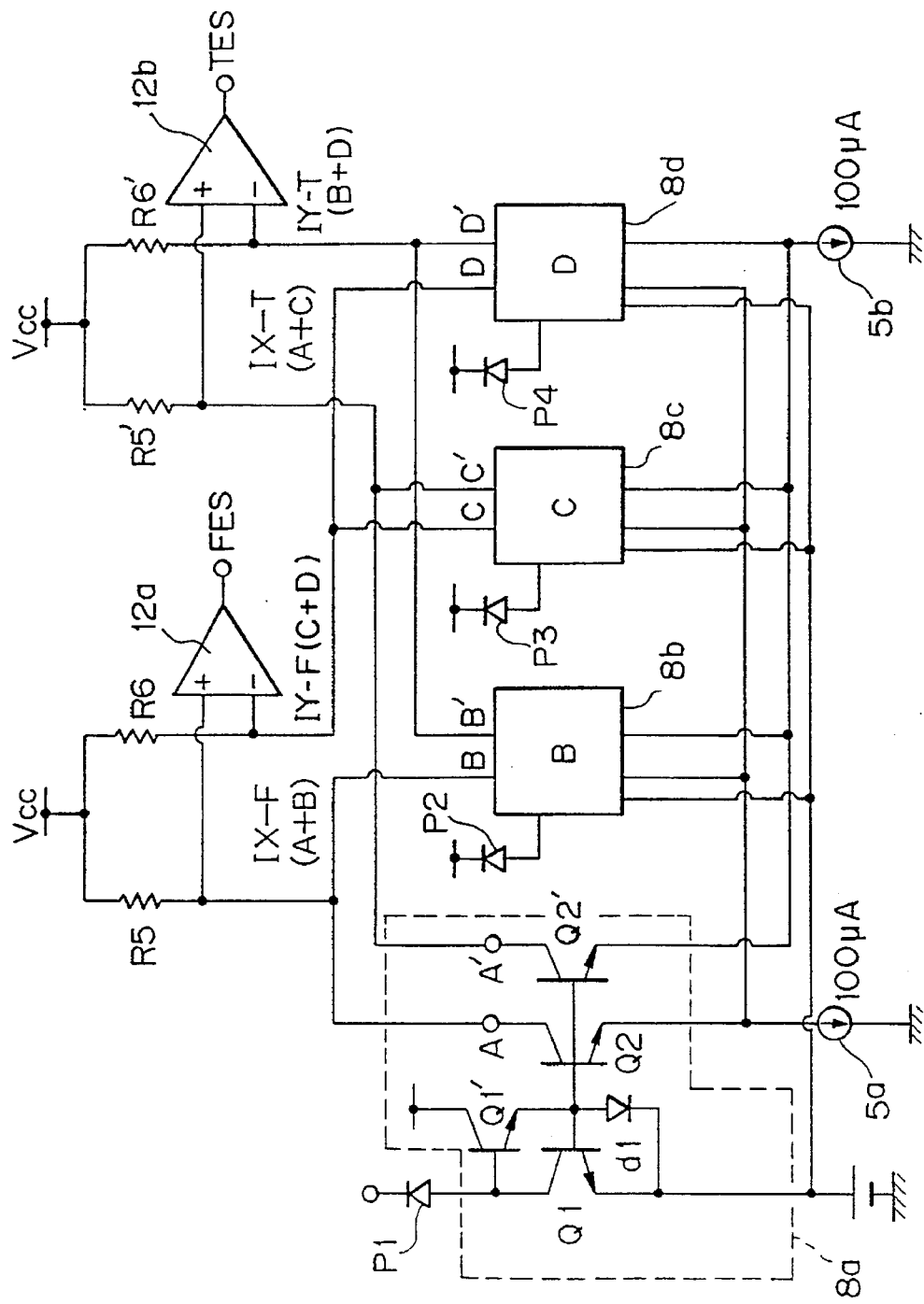
FIG. 9 is a circuit diagram showing a fifth preferred embodiment according to the present invention.

FIG. 9 is a circuit diagram showing a fifth preferred embodiment according to the present invention. Also in this figure, a servo-error signal generating circuit will be mainly illustrated.

In FIG. 9, four-divisional photo-detector units are utilized to simultaneously generate the tracking servo-error signal TES and the focusing servo-error signal FES. In this case, photo-detector units P1, P2, P3 and P4 are respectively connected to transistors Q1, Q3, Q5 and Q7 of the respective pairs of transistors 8a~8d. In this case, only four transistors Q1, Q1', Q2 and Q2', are illustrated, and the other twelve transistors Q3~Q8' are omitted, so that the drawing is not complicated.

In FIG. 9, the pairs of transistors 8a~8d include the respective pairs of transistors Q2, Q2', Q4, Q4', Q6, Q6', and Q8, Q8'. Further, such pairs of transistors 8a~8d respectively include the transistors Qi', Q3', Q5' and Q7' for compensating for the respective base currents and the high-speed diode d1, d3, d5 and d7(or otherwise d1, d2, d3, d4, d5, d6, d7 and d8 may be provided for all the pairs of transistors).

Further, a collector of the transistor Q2' of the pair of transistors 8a and a collector of the transistor Q6' of the pair of transistors 8c are connected in common to a resistor R5' for tracking servo control(indicated by IX-T). Further, a collector of the transistor Q4' of the pair of transistors 8b and a collector of the transistor Q8' of the pair of transistors 8d are connected in common to a resistor R6' for tracking servo control(indicated by IY-T).

Further, a collector of the transistor Q2 of the pair of transistors 8a and a collector of the transistor Q4 of the pair of transistors 8b are connected in common to a resistor R5 for focusing servo control(indicated by IX-F). Further, a collector of the transistor Q6 of the pair of transistors 8c and a collector of the transistor Q8 of the pair of transistors 8d are connected in common to a resistor R6 for tracking servo control(indicated by IY-F).

Further, the resistor R5' and the resistor R6' are are connected to two input terminals of an operational amplifier 12a for tracking servo control, respectively. Further, the resistor R5 and the resistor R6 are connected to two input terminals of an operational amplifier 12b for focusing servo control, respectively.

The operational amplifiers 12a, 12b output the tracking servo-error signal TES and the focusing servo-error signal FES, respectively.

In such a construction, by means of the resistors R5' and the resistor R6' for tracking servo control, two kinds of output voltages corresponding to (A+C)/(A+B+C+D) and (B+D)/(A+B+C+D) are generated, with respect to the detection levels A~D respectively corresponding to the detection currents in the photo-detectors P1–P4. Further, a difference between the two kinds of output voltages are calculated by the operational amplifier 12a, and finally the tracking servo-error signal TES, for which an AGC operation is executed, can be obtained.

In a similar manner, by means of the resistor R5 and the resistor R6 for focusing servo control, two kinds of output voltages corresponding to (A+B)/(A+B+C+D) and (C+D)/(A+B+C+D) are generated, with respect to the detection levels A~D respectively corresponding to the detection currents in the photo-detectors P1–P4. Further, a difference between the two kinds of output voltages are calculated by the operational amplifier 12b, and finally the focusing servo-error signal FES, for which an AGC operation is executed, can be obtained.

It should be noted that these pairs of transistors can be constituted by an IC, similar to the case of FIGS. 5 to 8.

Figure 10:
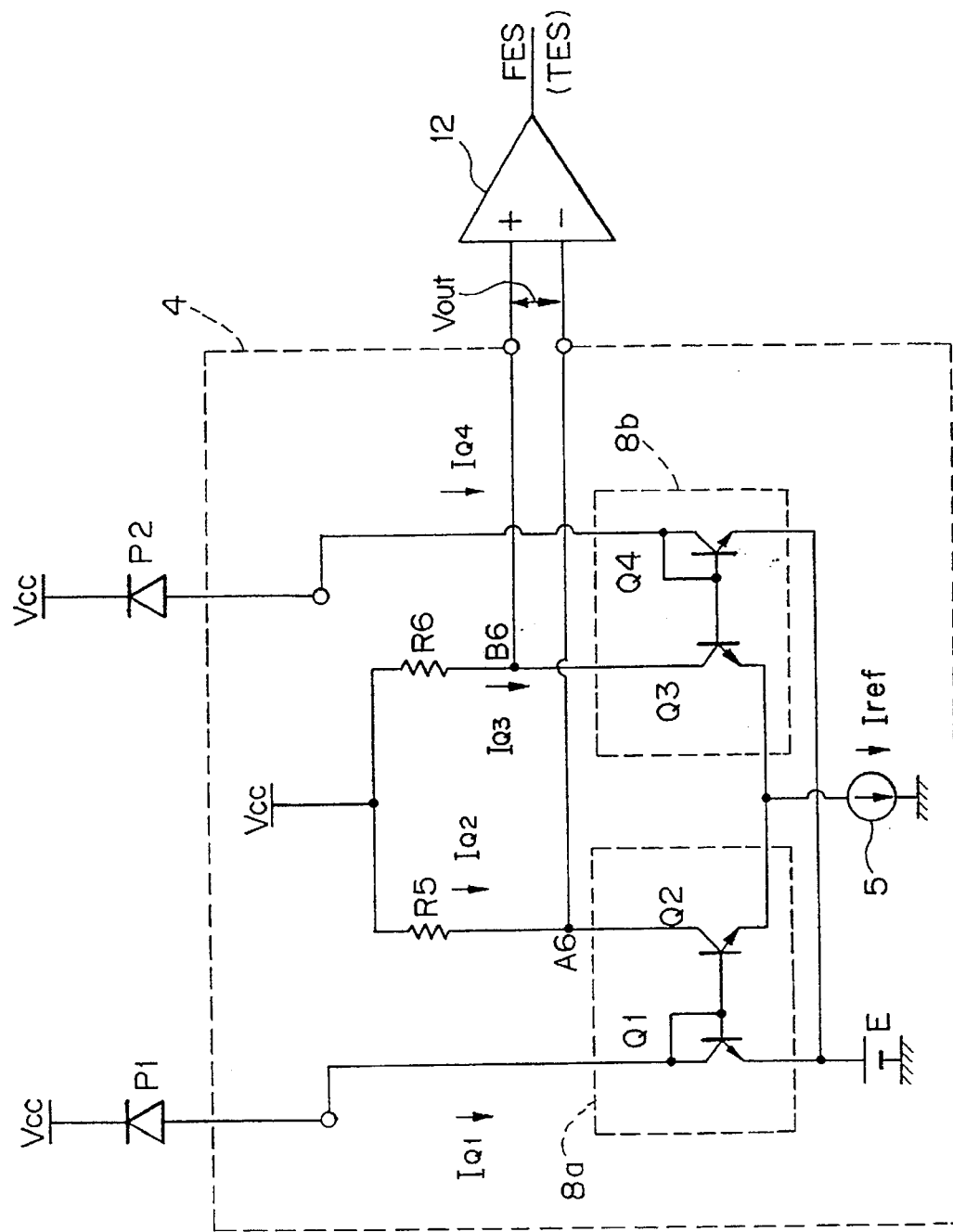
FIG. 10 is a circuit diagram showing a sixth preferred embodiment according to the present invention.

FIG. 10 is a circuit diagram showing a sixth preferred embodiment according to the present invention. In this figure, an example, in which a multiplier circuit of Gilbert type(hereinafter referred to as a Gilbert-multiplier circuit) according to the present invention is applied to a servo-error signal generating circuit of the magneto-optical disk device, is illustrated.

In FIG. 10, a servo-error signal generating circuit is adapted to generate the servo-error signal TES(FES) in accordance with a difference between the respective detection currents detected by two-divisional photo-detector units P1, P2 for detecting the return optical beam reflected from a magneto-optical disk 10(shown in FIG. 1(A)).

Further, in FIG. 10, the servo-error signal generating circuit is connected to a Gilbert-multiplier circuit, and the adequately modified servo-error signal generating circuit 4 for recording/reproducing operations of the magneto-optical disk 10 is constituted.

Here, the circuit configuration of such a servo-error signal generating circuit 4 will be briefly described. As shown in FIG. 10, the respective terminals of the resistors R5, R6 are both connected to a power supply of the voltages Vcc. Further, the other terminals of the resistors R5, R6 are connected to the respectively corresponding collectors of transistors Q2, Q3. Further, the respective emitters of transistors Q2, Q3 are connected in common to the same constant current source 5.

The output from one photo-detector units P1 is connected to the collector of the transistor Q1 in which a short circuit is formed between the collector and the base. Further, the emitter of the transistor Q1 is connected to another power supply of the voltage E. In this case, this power supply of the voltage E provides a bias voltage which is necessary for the constant current source to be operated and to generate the constant current Iref.

In a similar manner, the output from one photo-detector units P2 is connected to the collector of the transistor Q4 in which a short circuit is formed between the collector and the base. Further, the emitter of the transistor Q4 is connected to the power supply of the voltage E.

Here, the circuit 8a, 8b are so-called current-mirror circuit which is an important feature of the present invention.

The output signals of the Gilbert-multiplier circuit, which are taken out from the respective nodes A6, B6, are amplified by a differential amplifier(operational amplifier) 12, and the servo-error signal TES(FES) is obtained.

Further, the operation of the Gilbert-multiplier circuit in FIG. 8 will be described hereinafter.

The currents flowing through the transistors Q1, Q2, Q3 and Q4 are assumed to be IQ1, IQ2, IQ3 and IQ4, respectively. In this Gilbert-multiplier circuit, the emitters of the transistors Q1, Q4 are connected together into a common emitter, and the constant voltage E is applied to the common emitter. Further, the other emitter of the transistors Q2, Q3 are connected together to the constant current source 5.

In the case where the constant current is supplied to the Gilbert-multiplier circuit, the conditions similar to the case of FIG. 7 is satisfied.

To be more specific, the following relations as described in the equations (10A)~(10B) is obtained.

$$VBE1 = Vt \times \ln(IQ1/Is1)$$

$$VBE2 = Vt \times \ln(IQ2/Is2)$$

Where, $Vt = kT/8$.

The voltage $\Delta$ VBE generated between the bases of the respective transistors Q1, Q4 are expressed by the following equation (20).

$$\Delta VBE = VBE1 - VBE4 = Vt \times \ln(IQ1/Is1) - Vt \times \ln(IQ4/Is4) \quad (20)$$

Here, all the transistors Q1~Q4 are fabricated by the same process and have the same shape each other, and therefore Is1~Is4 are all equal, i.e., Is=Is1=Is2=Is3=Is4. The equation (20) is transformed into the following equation(21).

$$\Delta VBE = Vt \times \ln(IQ1/IQ4) \quad (21)$$

In a similar manner, the respective voltage$\Delta$ VBE generated between the bases of the respective transistors Q2, Q3 are expressed by the following equation(22).

$$\Delta VBE = Vt \times \ln(IQ2/IQ3) \quad (22)$$

Since the potentials of the bases of the respective transistors Q1, Q2 are equal with each other and also the potentials of the bases of the respective transistors Q3, Q4 are equal with each other, the equation(21) conforms to the equation(22). Therefore, the following equation(23) is obtained.

$$IQ1/IQ4 = IQ2/IQ3 \quad (23)$$

Here, in the case where IQ1 is equal to IQ4, and IQ2 is equal to IQ3, the equation(23) is valid.

Further, it should be noted that the value of (IQ2+IQ3) is constant, i.e., IQ2+IQ3=I=constant. The currents IQ2, IQ3 are converted to the respectively corresponding voltages by the resistors R5, R6. Further, two kinds of voltages taken out from the respective resistors R5, R6 are converted to the output voltage Vout, which is the signal of a single end, by the differential amplifier 12. Thus, the output voltage Vout is obtained in accordance with the value of quotient, in which a difference between the respective detection currents in the photo-detector P1, P2 is divided by a sum of the respective detection currents in the photo-detector P1, P2, with the limitation of a maximum amplitude IR(R1=R2=R) in the output voltage. Under such a condition, the following equation(24) is obtained.

$$\begin{aligned} Vout &= IQ2 \times R1 - IQ3 \times R2 \quad (24)\\ &= I \times (IQ2 \times R1)/(IQ2 + IQ3) - \\ &\quad I \times (IQ3 \times R2)/(IQ2 + IQ3)\\ &= IR \times (IQ2 - IQ3)/(IQ2 + IQ3)\\ &= IR \times (IQ1 - IQ4)/(IQ1 + IQ4) \end{aligned}$$

Figure 11:
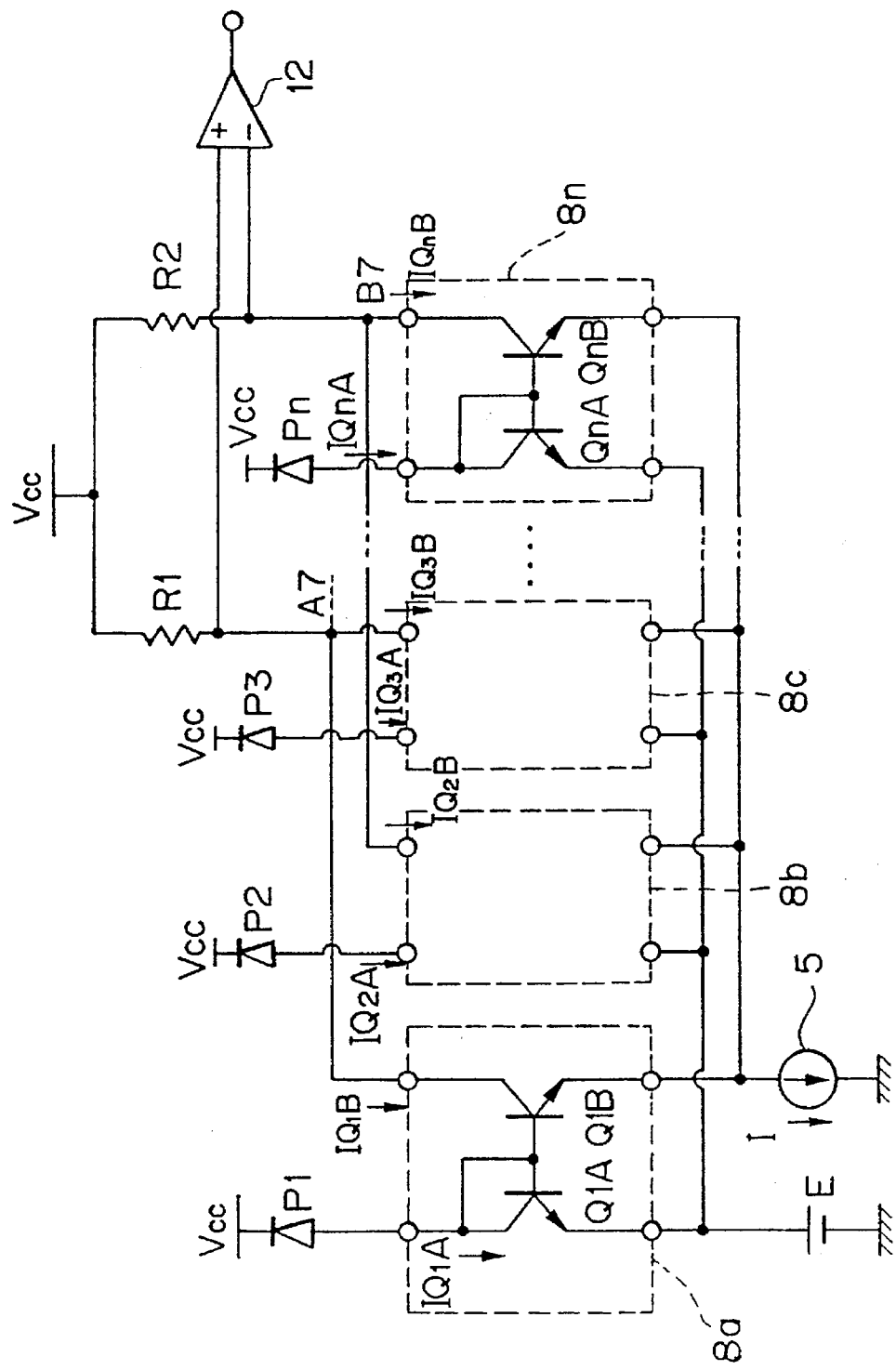
FIG. 11 is a circuit diagram showing a seventh preferred embodiment according to the present invention.
Figure 12:
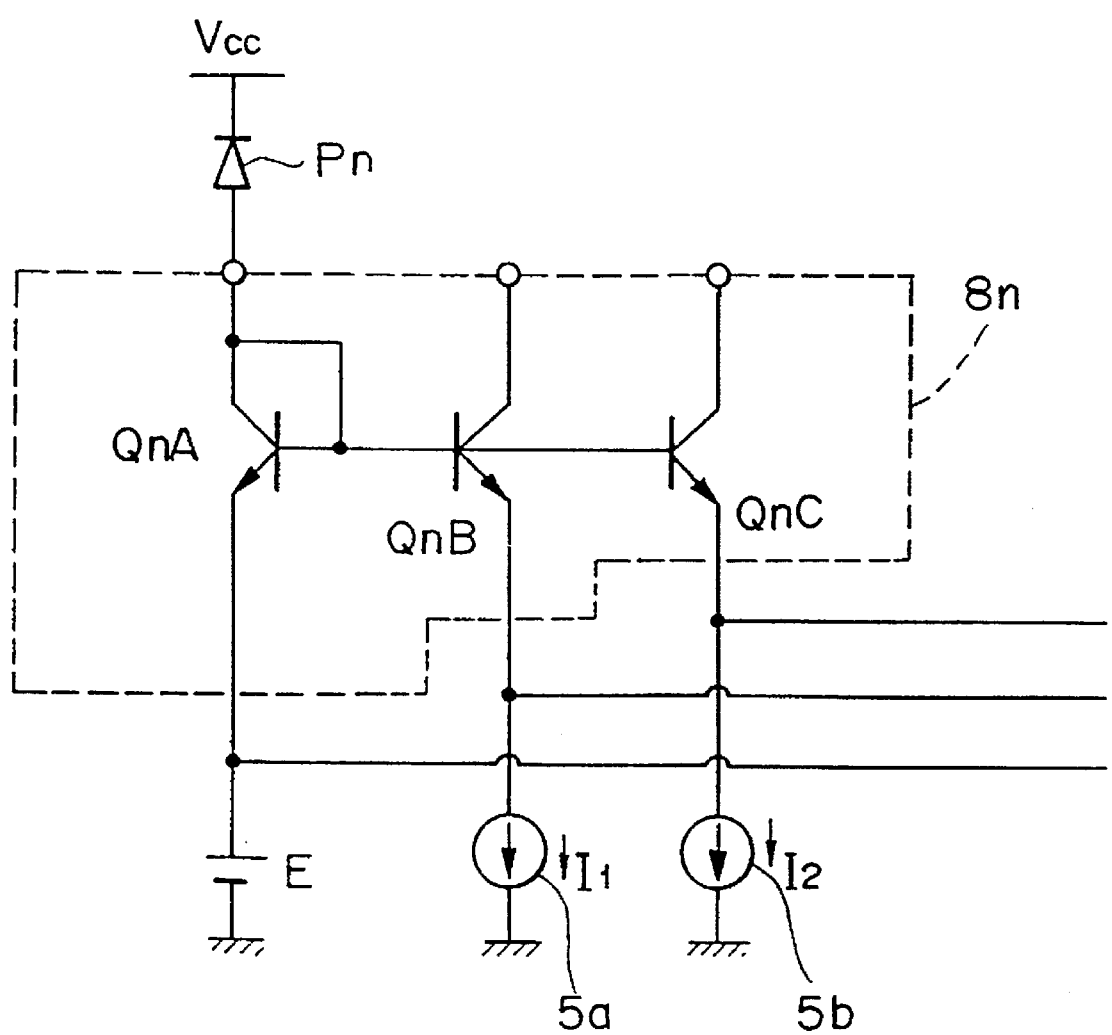
FIG. 12 is a circuit diagram showing a modification of the seventh preferred embodiment illustrated in FIG. 11.

FIG. 11 is a circuit diagrams showing a seventh preferred embodiment according to the present invention; and FIG. 12 is a circuit diagram showing a modification of the seventh preferred embodiment illustrated in FIG. 11.

FIG. 11 shows the tracking/focusing servo-error signal generating circuit in which at least three photo-detector units P1~Pn(n denotes any natural number), e.g., photo-diode, in the above-mentioned sixth embodiment as shown in FIG. 10.

In a plurality of current-mirror circuits 8a~8n(n denotes any natural number), all the emitters of the reference transistors Q1A~QnA are connected in common to the power supply of the voltage E. Further, all the emitters of the signal-output transistors Q1B~QnB are connected in common to the constant current source 5.

Further, the respective collectors of odd number of transistors Q1B, Q3B, . . . Q(2m+1)B (m also denotes any natural number) are connected to the power supply of the voltage Vcc, via a resistor R1. Further, the respective collectors of even number of transistors Q2B, Q4B, . . . Q2mB are connected to the power supply of the voltage Vcc, via a resistor R2.

Further, similar to the case of FIG. 10, the output voltages from the respective nodes A7, B7 are amplified by a differential amplifier 12. Further, the respective collectors of the transistors Q1A~QnA are connected to the corresponding anodes of the photo-detectors P1~Pn.

In this case, with respect to the currents flowing through the respective transistors Q1A~QnA and Q1B~QnB, the following equation(25) is obtained.

$$IQ1A:IQ2A:IQ3A: \ldots :IQnA = IQ1B: IQ2B: IQ3B: \ldots :IQnB \quad (25)$$

$$IQ1B + IQ2B + IQ3B + \ldots + IQnB = I \quad (26)$$

Here, in connecting the outputs of the signal-output transistors Q1B~QnB of the current-miller circuits 8a~8n to the nodes A7, B7, various connection methods can be selected, under the condition that the number of collectors connected to one node A7 must be equal to the number of collectors connected to the other node B7.

For example, the connection method of the collectors of the signal-output transistors Q1B~QnB when the number n is four(n=4) will be considered. The related circuit(n=4) is illustrated in FIG. 11. If the transistors Q1B~Q4B are connected as shown in FIG. 11, the output voltage Vout is obtained as expressed in the following equation(27), in a similar manner to the equation(24).

$$Vout = \frac{IR \times \{(IQ1A + IQ3A) - (IQ2A + IQ4A)\}}{(IQ1A + IQ2A + IQ2A + IQ3A)} \quad (27)$$

As apparent from the equation(27), it becomes possible for n(n=4) number of signals to be simultaneously controlled. Consequently, the circuit configuration is simplified, and the size of the circuit can be reduced.

In such a construction, even though the respective absolute values of the input signals are different from each other, the collector currents, respectively corresponding to the ratios of the detection currents IQ1A~IQnA, can be accurately taken out. Therefore, it is possible to keep a sum of the output currents from the current-mirror circuits 8a~8n definite.

Further, by connecting the outputs of the signal-output transistors Q1B~QnB to the nodes A7, B7 under the condition that the number of collectors connected to one node A7 is equal to the number of collectors connected to the other node B7, it becomes possible for the desired servo-error signals to be generated between the nodes A7, B7.

In FIG. 12, one of the current-mirror circuit blocks, in which the additional(third) transistors QnC are respectively connected in parallel to the transistors QnB, is illustrated representatively.

As shown in FIG. 12, the respective emitters of the third transistors QnC are coupled together and connected to a constant current source 5b(constant current I2 is generated). Further, each of the collectors of the third transistors QnC is adapted to be connected to the node which the collector of the transistor QnB on the same current-mirror circuit block is not connected.

When such a connection is executed, the output signal expressed by the following equation(28) is also obtained independently.

$$Vout = \frac{IR \times \{(IQ1A + IQ2A) - (IQ3A + IQ4A)\}}{(IQ1A + IQ2A + IQ3A + IQ4A)} \quad (28)$$

As apparent from the equations(27), (28), the circuit shown in FIG. 12 allows the different servo-error signals to be simultaneously generated from the same photo-detector (e.g., P1). Further, even though the relation represented by I1+I2=I is not satisfied, two different servo-error signals can be taken out.

Figure 13:
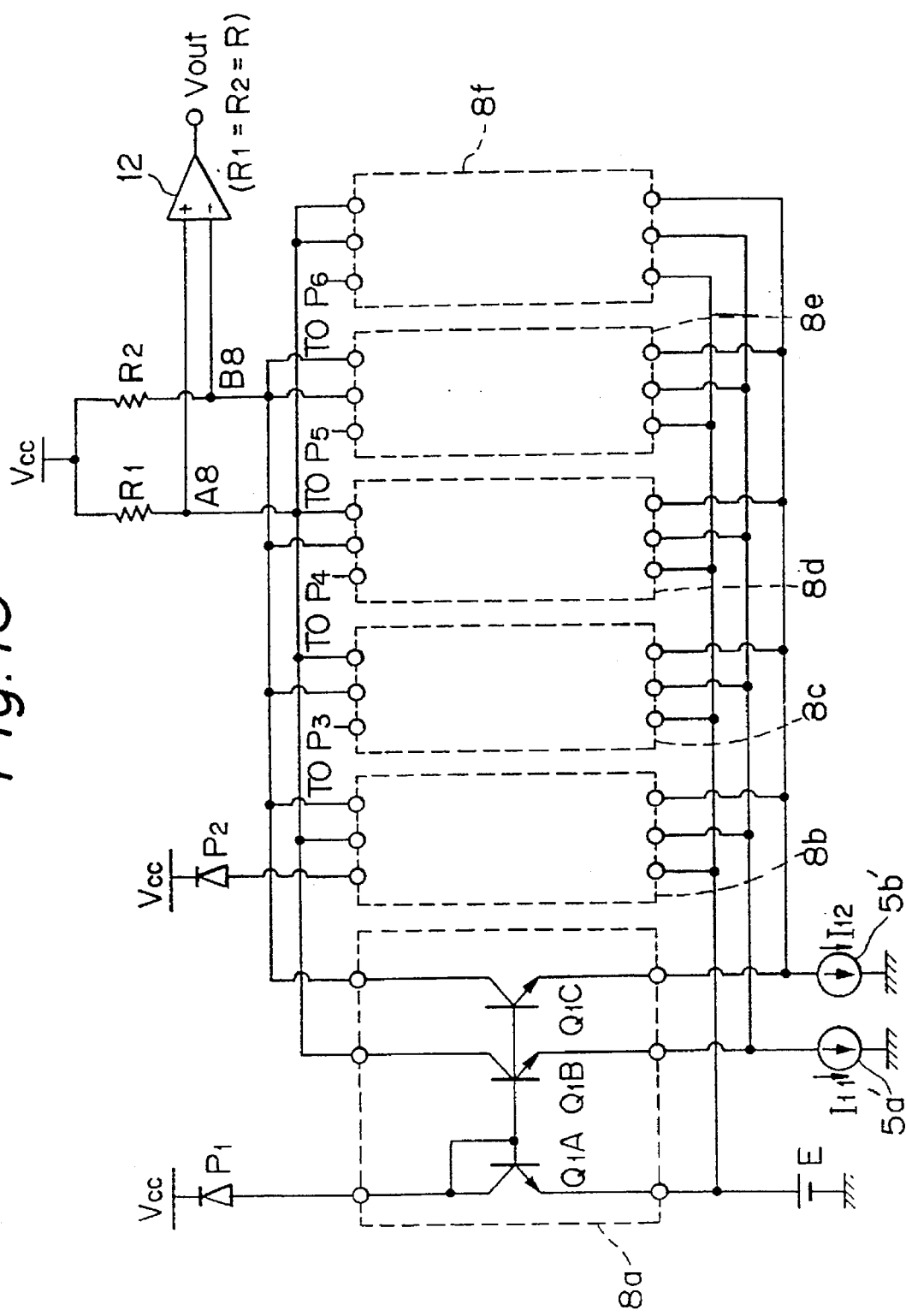
FIG. 13 is a circuit diagram showing an eighth preferred embodiment according to the present invention.

Further, in the case where the circuit of FIG. 12 is combined with the circuit of FIG. 13, it becomes possible for each of the collectors of the third transistors QnC is connected to the node which the collector of the transistor QnB on the same circuit block is not connected.

Therefore, two kinds of servo-error signals, e.g., a tracking servo-error signal and a focusing servo-error signal, can be simultaneously obtained. Further, it becomes possible for the common reference transistor of a single transistor to be provided, the area which will be occupied by a plurality of reference transistors in the prior art can be reduced.

FIG. 13 is a circuit diagram showing a eighth preferred embodiment according to the present invention. In this case, the circuits of FIG. 12 are arranged in parallel by utilizing the transistors QnB, QnC and the constant current sources 5a,' 5b'.

In FIG. 13, all the emitters of the transistors Q1B~QnB are connected in common to the constant current source 5a' (the constant current I11 is generated). Further, all the emitters of the transistors Q1C~QnC are connected in common to the constant current source 5b' (the constant current I12 is generated). Further, the circuit is controlled so that the value of (I11+I12) is always constant(I1).

Further, the respective collectors of the transistors Q1B, Q2B, Q3C, Q4C, Q6B and Q6C are connected in common to a resistor R1, while the respective collectors of the transistors Q1C, Q2C, Q3B, Q4B, Q5B and Q5C are connected in common to a resistor R2. Further, the differential voltage between the resistors R1, R2 is amplified by the differential amplifier 12, and finally the output voltage Vout as expressed by the following equation(29) is obtained.

$$Vout = IR \times [\{\alpha1(IQ1A + IQ2A + IQ6A) + \quad (29)$$
$$\alpha2(IQ3A + IQ4A + IQ6A)\} -$$
$$\{\alpha1(IQ3A + IQ4A + IQ5A) +$$
$$\alpha2(IQ1A + IQ2A + IQ5A)\}]/$$
$$(IQ1A + IQ2A + IQ3A + IQ4A + IQ5A + IQ6A)$$

Where, $\alpha1 = I11/(I11+I12)$ $\alpha2 = I12/(I11+I12)$ $\alpha1 + \alpha2 = 1$ Taking into account the fact that $\alpha1+\alpha2=1$, the equation (29) is transformed, and the following equation(30) is obtained.

$$Vout = IR \times [\{\alpha1(IQ1A + IQ2A) + \quad (30)$$
$$\alpha2(IQ3A + IQ4A) + IQ6A\} -$$
$$\{\alpha1(IQ3A + IQ4A) + \alpha2(IQ1A + IQ2A) + IQ5A\}]/$$
$$(IQ1A + IQ2A + IQ3A + IQ4A + IQ5A + IQ6A)$$

Further, it is assumed that $\alpha1-\alpha2=(I11-I12)(I11+I12)=\alpha$, and the equation(30) is transformed, and the following equation(31) is obtained.

$$Vout = IR \times [\{(IQ1A + IQ2A)\alpha + IQ6A\} - \quad (31)$$
$$\{(IQ3A + IQ4A)\alpha + IQ5A)\}]/$$
$$(IQ1A + IQ2A + IQ3A + IQ4A + IQ5A + IQ6A)$$

As apparent from the equation(31), by adequately changing the value of $\alpha$, the eighth embodiment has the advantage that the contribution factors of the respective currents IQ1A, IQ2A, IQ3A and IQ4A can be easily selected. In other words, in the case where the content of the servo-error signal is desired to be changed, it becomes possible for each of the input signals to be given an adequate weight. The eighth embodiment shown in FIG. 13 corresponds to the construction in which each of the transistors QnB is divided into two parts and a sum of the currents I11, I12 is adjusted to a constant value in the eighth embodiment of FIG. 11. The eighth embodiment can be also utilized for the servo control by six-divisional photo-detector.

Figure 14:
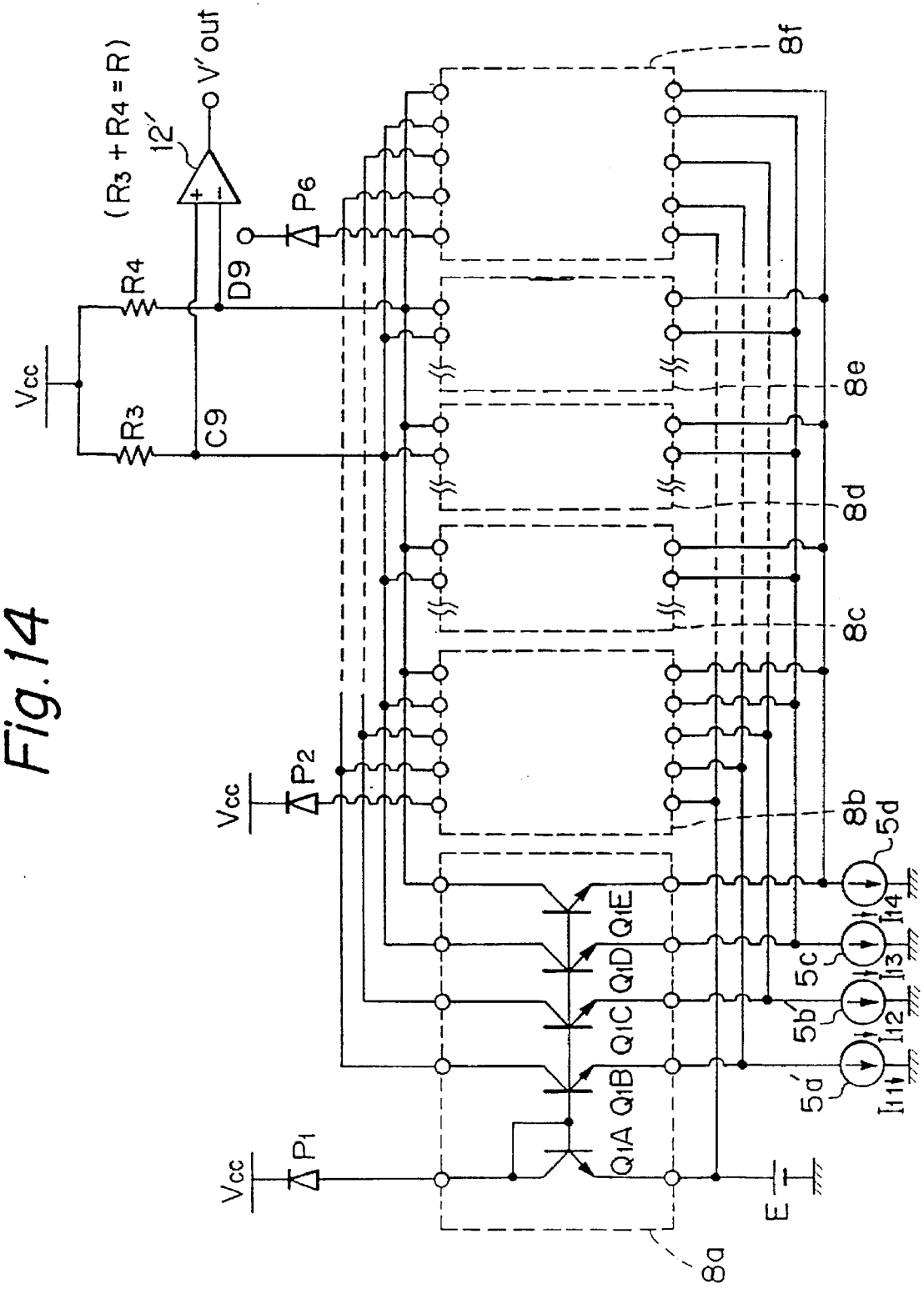
FIG. 14 is a circuit diagram showing a ninth preferred embodiment according to the present invention.
Figure 15:
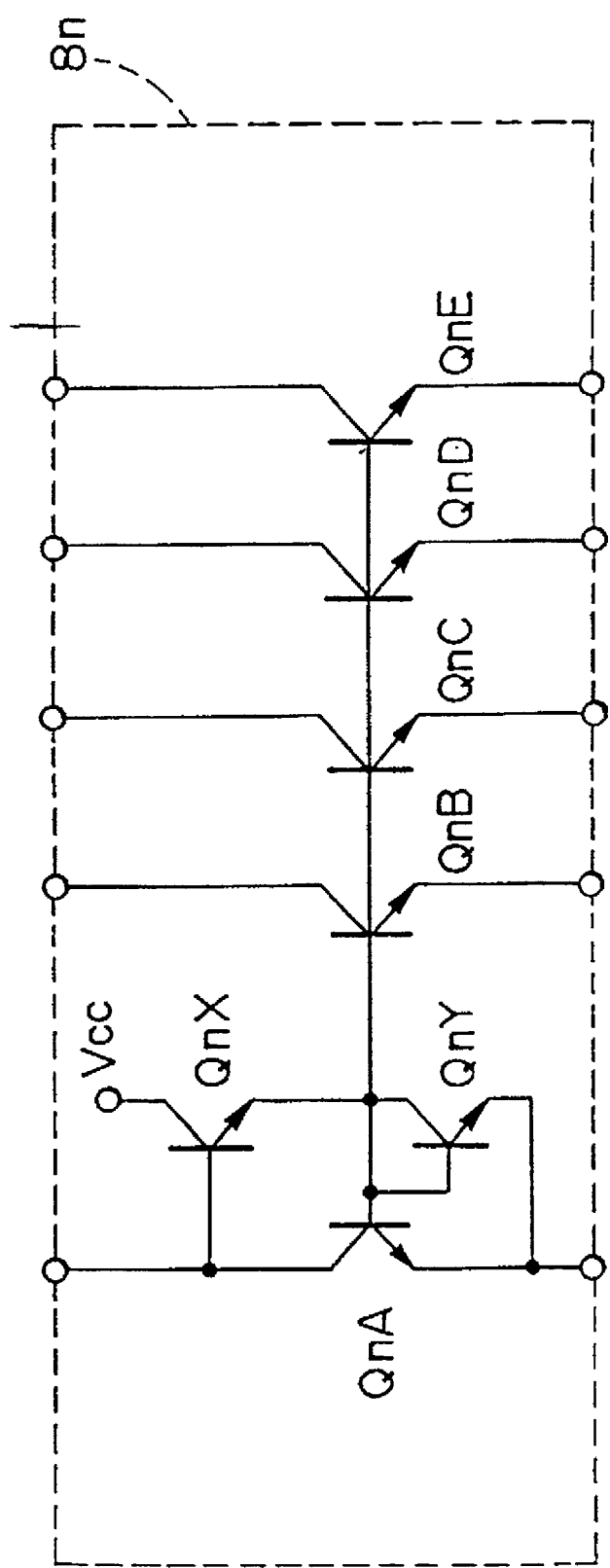
FIG. 15 is a circuit diagram showing a modification of the ninth preferred embodiment illustrated in FIG. 14.

FIG. 14 is a circuit diagram showing a ninth preferred embodiment according to the present invention; and FIG. 15 is a circuit diagram showing a modification of the ninth preferred embodiment illustrated in FIG. 14.

In this case, the circuits of FIG. 14 are arranged by adding a plurality of transistors QnD, QnE, constant current sources 5c, 5d, resistors R3, R4 and an operational amplifier 12' to the eighth embodiment of FIG. 13.

Here, the output voltage Vout' as expressed by the following equation(32) is obtained.

$$Vout' = IR \times [\{(IQ1A + IQ2A)\beta + IQ6A\} - \quad (32)$$
$$\{(IQ3A + IQ4A)\beta + IQ5A)\}]/$$
$$(IQ1A + IQ2A + IQ3A + IQ4A + IQ5A + IQ6A)$$

Where, it is assumed that $\beta=(I13-I14)/(I13+I14)$.

As apparent from the equation(32), the ninth embodiment can also utilized for the servo control by six-divisional photo-detector. To be more specific, in the case where each content of two kinds of servo-error signals is desired to be changed independently, it becomes possible for each of the input signals to be given an adequate weight so that two kinds of servo-error signals do not interfere with each other.

Further, in FIG. 14, the base voltage are utilized in common in each current-mirror circuit block, and then the base current in the transistors QnA~QnE in each block is subtracted from the original detection current in each photo-detector. Therefore, the focusing servo-error signal obtained from the equation(31) and the tracking servo-error signal obtained from the equation(32) cause some numerical errors.

To minimize such numerical errors, in FIG. 15, each of the transistors QnX is connected in Darlington connection, and each of the base currents in the transistors QnA~QnE is supplied from the power supply of the voltage Vcc, via each transistor Qnx.

Further, to execute turn-off operations of the transistors QnA~QnE at high speed, the by-pass current is adapted to flow from each base-line to the emitter in each transistor QnA. In general, the resistor is connected to the emitter of each of the transistors. However, in FIG. 15, the by-pass circuit is formed by each transistor QnY. In such a method, each transistor Qnx is prevented from having an influence on the detection current as the error component, even in the case where the detection current is extremely low. Namely, in the ninth embodiment, by-pass current can be adjusted in accordance with the level of the detection current.

As described above, the present invention has been illustrated with respect to several preferred embodiments applied to a magneto-optical disk device. However, the present invention is also applicable to an optical disk device and an optical card, or the like, which utilizes an optical beam for recording/reproducing operations.

While the present invention has been described as related to the preferred embodiments, it will be understood that various changes and modifications may be made without departing from the spirit and the scope of the invention as hereinafter claimed.

We claim:

1. A positioning control system utilizing an optical beam in which recording/reproducing operations are performed by irradiating the optical beam to a predetermined position on an optical recording medium, comprising:

a photo-detector constituted by at least two-divisional photo-detector units; and a servo-error signal generating circuit which generates at least one servo-error signal for servo control of said optical beam in accordance with a difference between respective detection currents detected by said photo-detector units for detecting a return optical beam reflected from said recording medium, so as to accurately irradiate an original optical beam to a desired position on the basis of said servo-error signal, wherein said servo-error signal generating circuit includes:

at least one division circuit that has two pairs of transistors, two emitters in each pair of said two pairs of transistors being connected together into a common emitter, bias voltages of direct current type being applied to the respective bases corresponding to transistors on one side in the respective pairs of transistors, the respective collectors corresponding to said transistors on one side in the respective pairs of transistors being connected to a common connecting portion via corresponding resistors, said common connecting portion being connected to a power supply, the respective bases corresponding to transistors on the other side in the respective pairs of transistors being connected together into a common base; and an integrating capacitor which is connected to said common base corresponding to said transistors on the other side, and which integrates a difference between the current equivalent to the current flowing through said common connecting portion of said respective collectors and a predetermined reference current, to apply the thus integrated difference to said common base corresponding to said transistors on the other side, wherein an anode of said photo-detector units are respectively connected to said common emitters in the respective pairs of said transistors via a plurality of current-mirror circuits, so that said respective detection currents can flow through said common emitters, and wherein said division circuit is operative to obtain said servo-error signal from the respective potentials of said respective collectors corresponding to said transistors on one side.

2. A positioning control system as set forth in claim 1, wherein a cathode of each of said photo-detector units is connected directly to said power supply.

3. A positioning control system utilizing an optical beam in which recording/reproducing operations are performed by irradiating the optical beam to a predetermined position on an optical recording medium, comprising:

a photo-detector constituted by four-divisional photo-detector units; and a servo-error signal generating circuit which generates at least one servo-error signal for servo control of said optical beam in accordance with a difference between respective detection currents detected by said photo-detector units for detecting a return optical beam reflected from said recording medium, so as to accurately irradiate an original optical beam to a desired position on the basis of said servo-error signal, wherein said servo-error signal generating circuit includes:

a plurality of division circuits with each circuit having two pairs of transistors, two emitters in each pair of said two pairs of transistors being connected together into a common emitter, bias voltages of direct current type being applied to the respective bases corresponding to transistors on one side in the respective pairs of transistors, the respective collectors corresponding to said transistors on one side in the respective pairs of transistors being connected to a common connecting portion via corresponding resistors, said common connecting portion being connected to a power supply, the respective bases corresponding to transistors on the other side in the respective pairs of transistors being connected together into a common base; and an integrating capacitor which is connected to said common base corresponding to said transistors on the other side, and which integrates a difference between the current equivalent to the current flowing through said common connecting portion of said respective collectors and a predetermined reference current, to apply the thus integrated difference to said common base corresponding to said transistors on the other side, wherein said photo-detector units are respectively connected to said common emitters in the respective pairs of said transistors in each division circuit, so that said respective detection currents can flow through said common emitters, and wherein said division circuit is operative to obtain said servo-error signal from the respective potentials of said respective collectors corresponding to said transistors on one side.

4. A positioning control system as set forth in claim 3, wherein said plurality of division circuits are operative to obtain a tracking servo-error signal for tracking servo control and a focusing servo-error signal for focusing servo control.

* * * * *

UNITED STATES PATENT AND TRADEMARK OFFICE
CERTIFICATE OF CORRECTION

PATENT NO. : 5,636,191
DATED : June 3, 1997
INVENTOR(S) : Minami et al.

It is certified that error appears in the above-indentified patent and that said Letters Patent is hereby corrected as shown below:

On the Title Page:

Under "[57] Abstract", line 3, delete "predertermined" and insert --predetermined-- therefor.

Column 4, line 11, delete "ore" and insert --one-- therefor.

Column 6, line 41, delete "(A4+B4+C4+D4)" and insert --/(A4+B4+C4+D4+)-- therefor.

Column 9, line 2, delete "applied" and insert --be applied-- therefor.

Column 12, line 30, delete "each other".

Column 13, line 34, delete "When" and insert --when-- therefor.

Column 17, line 48, delete "Qi' and insert --Q1'-- therefor.

Column 18, line 1, delete "are are" and insert --are-- therefor.

UNITED STATES PATENT AND TRADEMARK OFFICE
CERTIFICATE OF CORRECTION

PATENT NO. : 5,636,191
DATED : June 3, 1997
INVENTOR(S) : Minami et al.

It is certified that error appears in the above-indentified patent and that said Letters Patent is hereby corrected as shown below:

Column 18, line 58, delete "units" and insert --unit-- therefor.

Column 18, line 67, delete "units" and insert --unit-- therefor.

Column 19, line 4, delete "circuit" and insert -- circuits-- therefor.

Column 19, line 21, delete "is" and insert --are-- therefor.

Column 19, line 23, delete "is" and insert --are-- therefor.

Column 19, line 31, delete "are" and insert --is-- therefor.

Column 19, line 37, delete "each other".

Column 19, line 44, delete "are" and insert --is-- therefor.

UNITED STATES PATENT AND TRADEMARK OFFICE
CERTIFICATE OF CORRECTION

PATENT NO. : 5,636,191
DATED : June 3, 1997
INVENTOR(S) : Minami et al.

It is certified that error appears in the above-indentified patent and that said Letters Patent is hereby corrected as shown below:

Column 20, line 11, delete "diagrams" and insert --diagram-- therefor.

Column 21, line 20, delete "which" and insert --to which-- therefor.

Column 21, line 47, delete "a" (2nd occurrence) and insert --an-- therefor.

Column 21, line 63, delete "are." and insert --are-- therefor.

Column 22, line 24, delete "(I11+I12)" and insert --/(I11+I12)-- therefor.

Signed and Sealed this

Ninth Day of June, 1998

*Attest:*

BRUCE LEHMAN

*Attesting Officer*     *Commissioner of Patents and Trademarks*